US012566116B2

(12) United States Patent
Konijnenberg et al.

(10) Patent No.: US 12,566,116 B2
(45) Date of Patent: Mar. 3, 2026

(54) METHOD AND APPARATUS OF PREPARING A SAMPLE OF ONE OR MORE MOLECULE(S) FOR IMAGING WITH A CRYO-ELECTRON MICROSCOPE

(71) Applicants: FEI Company, Hillsboro, OR (US); Oxford University Innovation Limited, Oxford (GB)

(72) Inventors: Albert Konijnenberg, Eindhoven (NL); Tim Esser, Oxford (GB); Paul Fremdling, Dresden (DE); Joe Gault, Oxford (GB); Stephan Rauschenbach, Oxford (GB)

(73) Assignees: FEI Company, Hillsboro, OR (US); Oxford University Innovation Limited, Oxford (GB)

( * ) Notice: Subject to any disclaimer, the term of this patent is extended or adjusted under 35 U.S.C. 154(b) by 382 days.

(21) Appl. No.: 18/087,441

(22) Filed: Dec. 22, 2022

(65) Prior Publication Data
US 2023/0280245 A1 Sep. 7, 2023

(51) Int. Cl.
G01N 1/42 (2006.01)
G01N 23/2202 (2018.01)
(Continued)

(52) U.S. Cl.
CPC ........... G01N 1/42 (2013.01); G01N 23/2202 (2013.01); G01N 23/2251 (2013.01); H01J 37/20 (2013.01)

(58) Field of Classification Search
CPC .. G01N 1/42; G01N 23/2202; G01N 23/2251; G01N 1/2813; G01N 1/28;
(Continued)

(56) References Cited

U.S. PATENT DOCUMENTS

2013/0205808 A1* 8/2013 Mulders .................. G01N 1/42
62/62
2019/0170625 A1* 6/2019 Nijpels .................. H01J 37/20
(Continued)

FOREIGN PATENT DOCUMENTS

| GB | 2598762 A | 3/2022 | |
| GB | 2614323 A * | 7/2023 | ........... G01N 1/2813 |
| WO | 2019010436 A1 | 1/2019 | |

OTHER PUBLICATIONS

EP22214294.5, Extended European Search Report, May 22, 2023, 8 pages.
(Continued)

*Primary Examiner* — David A Vanore
(74) *Attorney, Agent, or Firm* — Michael Best & Friedrich LLP

(57) ABSTRACT

The present invention relates to a method of preparing a sample of one or more molecule(s) for imaging with a cryo-electron microscope. The method comprises providing a carrier substrate, cryogenically cooling the carrier substrate to form a cryogenically-cooled carrier substrate, generating gas phase ions of the one or more molecule(s) by electrospray ionisation, decelerating the gas phase ions, receiving the gas phase ions on the cryogenically-cooled carrier substrate to form a sample for imaging with a cryo-electron microscope and shielding the cryogenically-cooled carrier substrate after the step of receiving the ions on the cryogenically-cooled carrier substrate. The step of decelerating the ions reduces the energy of each of the ions to be less than 20 eV per charge when received at the cryogenically-cooled carrier substrate. The present invention also relates to an apparatus for preparing a sample of one or more molecule(s) for a cryo-electron microscope.

20 Claims, 20 Drawing Sheets

(51) Int. Cl.
    *G01N 23/2251*     (2018.01)
    *H01J 37/20*      (2006.01)

(58) Field of Classification Search
    CPC ........ G01N 1/312; H01J 37/20; H01J 49/063;
                                   H01J 49/165
    See application file for complete search history.

(56)              References Cited

U.S. PATENT DOCUMENTS

| | | | |
|---|---|---|---|
| 2020/0132695 A1* | 4/2020 | Konijnenberg .. | G01N 35/00663 |
| 2020/0158607 A1* | 5/2020 | Coon ....................... | G01N 1/42 |
| 2020/0411282 A1* | 12/2020 | Straw ...................... | H01J 37/20 |
| 2022/0115205 A1* | 4/2022 | Straw .................. | H01J 49/4215 |
| 2023/0057900 A1* | 2/2023 | Nelson ............... | G01N 23/2055 |
| 2023/0280245 A1* | 9/2023 | Konijnenberg ...... | G01N 1/2813 |
| | | | 250/443.1 |
| 2024/0021407 A1* | 1/2024 | Straw ...................... | H01J 37/26 |
| 2024/0060863 A1* | 2/2024 | Westphall ................ | G01N 1/42 |

OTHER PUBLICATIONS

Esser T.K., et al., "Mass-Selective and Ice-Free Cryo-EM Protein Sample Preparation via Native Electrospray Ion-Beam Deposition," bioRxiv, Oct. 19, 2021, XP93044445, pp. 1-29, Retrieved from the Internet URL: https://www.biorxiv.org/content/10.1101/2021.10.18. 464782v1.full.pdf.

Esser T.K., et al., "Mass-Selective and Ice-Free Electron Cryomicroscopy Protein Sample Preparation via Native Electrospray Ion-Beam Deposition," PNAS Nexus, Aug. 6, 2022, vol. 1, No. 4, XP093044313, pp. 1-13, Retrieved from the Internet URL: https://academic.oup. com/pnasnexus/article-pdf/1/4/pgac153/48849457/pgac153.pdf.

Esser T.K., et al., "Supplementary Information Mass-Selective and Ice-Free Cryo-EM Protein Sample Preparation via Native Electrospray Ion-Beam Deposition," Oct. 19, 2021, XP93044434, pp. 1-9, retrieved from the Internet URL: https://academic.oup.com/pnasnexus/article/ 1/4/pgac153/6657819?login=true#supplementary-data.

Guntupalli S.R., et al., "Cryo-Electron Microscopy Structures of Yeast Alcohol Dehydrogenase," Biochemistry, Feb. 23, 2021, vol. 60, No. 9, XP093044459, pp. 663-677.

Longchamp J., et al., "Imaging Proteins at the Truly Single Molecule Level," May 1, 2016, XP055303108, 18 pages, Retrieved from the Internet URL: http://arxiv.org/abs/1512.08958v2.

Mikhailov V.A., et al., Mass-Selective Soft-Landing of Protein Assemblies with Controlled Landing Energies, Analytical Chemistry, American Chemical Society, 2014, vol. 86, pp. 8321-8328.

Rohou A., et al., "CTFFIND4: Fast and Accurate Defocus Estimation from Electron Micrographs," Journal of Structural Biology, Aug. 13, 2015, vol. 192, No. 2, XP029293557, pp. 216-221.

Yip K.M., et al., "Atomic-Resolution Protein Structure Determination by cryo-EM," Nature, Oct. 21, 2020, vol. 587, No. 7832, XP037295110, pp. 157-161.

European Patent Office. European Search Report for Application No. 25179416.0, dated Jul. 4, 2025 (5 pages).

* cited by examiner

METHOD AND APPARATUS OF PREPARING A SAMPLE OF ONE OR MORE MOLECULE(S) FOR IMAGING WITH A CRYO-ELECTRON MICROSCOPE

BACKGROUND

For imaging biomolecules, such as proteins, TEM micros-copy cannot readily be used due to the low contrast of organic matter and its sensitivity to radiation damage and dehydration. While some limitations can be circumvented by negative stain EM, where the molecular shape is molded with heavy atom-containing salts, this method sacrifices access to high resolution and internal structural information. It is known that cryo-electron microscopy (cryo-EM) allows for high resolution imaging, even if molecules are intrac-table to crystallization and too large for NMR. Indeed, in recent years, it has evolved into one of the leading methods for structural characterization of folded proteins and protein complexes at atomic resolution. In known arrangements, enriched and purified bio-molecule solutions are applied to TEM carrier substrates, which are then blotted and rapidly submerged into liquid ethane, forming thin layers of vitreous (amorphous) ice and preserving native structure. However, the submerging of the carrier substrates containing the molecules into liquid ethane may cause damage to the molecules. Reliable preparation of pure and homogeneous cryo-EM samples remains one of, if not the, most important challenge in cryo-EM and makes determination of high-resolution structures challenging and often impossible.

Expression, solubilization, purification, and embedding in vitreous ice is challenging, due to large heterogeneity induced by different conformations, post-translational modi-fications, lipids, ligands, and interacting proteins. Fragile biomolecules, and membrane proteins in particular, can get distorted, fragmented, or unfolded during sample enrich-ment and purification, at the substrate-solvent and air-solvent interface, due to blotting, evaporation-induced buf-fer modification, and during plunge freezing. Consequently, unambiguous assignment of single-particle images to dif-ferent oligomers, conformers, fragments, and contaminants is often not possible, limiting resolution and hiding confor-mational flexibility. Several additional problems are induced by the solvent and ice itself. If the ice layer is too thick, the reconstruction can be complicated by a Zheight distribution of particles. Thicker ice also increases the number of inelas-tically and multiply scattered electrons, decreasing the sig-nal-to-noise ratio (SNR) even when using an energy filter. If the solvent layer is too thin, on the other hand, surface tension can cause an inhomogeneous particle distribution and even aggregation before freezing. In addition, particles will possibly be air-dried at the air-solvent interface before freezing. Conditions for favorable ice thickness can typi-cally be found by optimizing the vitrification procedure, but it is practically impossible to achieve a perfectly even thin film across the whole carrier substrate using known tech-niques. Image resolution is limited by beam-induced motion, which likely originates from mechanical stress in the ice due to different cooling rates during plunge freezing.

Sample preparation based on native mass spectrometry and ion-beam deposition has previously been suggested and explored experimentally, as discussed in Mikhailov, V. A.; Mize, T. H.; Benesch, J. L. P.; Robinson, C. V. Mass-Selective Soft-Landing of Protein Assemblies with Con-trolled Landing Energies. Anal. Chem. 2014, 86, 8321-8328 and US2020411282 A2. In pioneering experiments Mikhailov et al. used a modified quadrupole time-of-flight mass spectrometer (Q-ToF MS) and negative stain EM to demonstrate that GroEL and apoferritin remained globular after in-vacuum deposition. However, the sample quality was limited by low ion-beam intensity (below 1 pA), lack of landing energy control (tens of eV per charge), and the use of staining, resulting in images without subunit resolution.

Further difficulties of current known sample preparation techniques are the lack of reproducibility due to the high level of manual intervention during vitrification as well as preferred orientation of proteins or protein structure dete-rioration due to adherence of certain proteins to the air-solvent interface. It is further difficult and laborious to separate proteins during sample preparation if they are not distinct by large differences in conformation, affinity or shape. These difficulties lead to reduced resolution in recon-structed protein structures.

In summary, sample preparation remains one of the major challenges hindering successful cryo-EM imaging.

SUMMARY

The present invention provides a method of preparing a sample of one or more molecule(s) for imaging with a cryo-electron microscope, the method comprising: provid-ing a carrier substrate; cryogenically cooling the carrier substrate to form a cryogenically-cooled carrier substrate; generating gas phase ions of the one or more molecule(s) by electrospray ionisation; decelerating the gas phase ions; and receiving the gas phase ions on the cryogenically-cooled carrier substrate to form a sample for imaging with a cryo-electron microscope, wherein the step of decelerating the gas phase ions reduces the energy of each of the gas phase ions to be less than 20 eV per charge when received at the cryogenically-cooled carrier substrate.

The method of the present invention enables molecules, such as proteins in their native state, to be prepared for cryo-EM imaging reliably while minimizing damage to the molecules. In the present invention, the gas phase ions are received onto a carrier substrate that is already cryogenically cooled and the gas phase ions are frozen on impact with the carrier substrate. This reduces damage to the molecules compared to known techniques where the molecules are landed on a carrier substrate that is subsequently submerged into coolant. For example, in an arrangement where the molecules are proteins in their native state, the proteins would be frozen on impact with the cryogenically cooled carrier substrate while maintaining their conformation. Indeed, freezing the ions on impact necessarily reduces their thermal motion and consequently reduces thermally medi-ated deformation of proteins in their native state.

The present invention further mitigates damage to the molecules by reducing the energy of the ions, to be less than 20 eV per charge when received at the cryogenically-cooled carrier substrate (reducing the landing energy of the ions). The energy of the ions when received at the cryogenically-cooled carrier substrate as referred to herein may be the kinetic energy of the ions.

Indeed, receiving the gas phase ions prepared by electro-spray ionisation on a cryogenically-cooled carrier substrate with a kinetic energy of less than 20 eV per charge reduces damage to the molecules during preparation of the sample for cryo-EM. Preventing damage to the molecules is par-ticularly important when the molecules are proteins in one of their native states.

By reducing the kinetic energy of the ions when landing on the carrier substrate and also landing the ions on a carrier substrate that has been cryogenically-cooled, the particles are also substantially immobilised on the carrier substrate at the position where they are received. This enables ions of different types to be focussed and received on different areas of the carrier substrate as discussed in further detail below. Focussing ions of different types on different areas of the carrier substrate may generate samples having areas of homogeneity thereby increasing the resolution during cryo-EM imaging.

The kinetic energy per charge of each ion is the total kinetic energy of the ion divided by the number of charges on the molecule. For example, the kinetic energy per charge of an ion having a +2 charge state would be its total kinetic energy divided by 2.

A beam detector, which may comprise a grid with variable electric potential and a detector electrode, may be used to measure the total energy of an ion beam per charge, the ion beam referred to herein refers to the beam containing the gas phase ions. At the detector electrode, ion-beam transition through the grid may be measured. The graph of ion-beam transition against grid potential is typically Gaussian shaped and the derivate of this graph provides the total ion beam energy distribution. For an ideal ion beam, with no energy width, setting the potential applied to the cryogenically-cooled carrier substrate to be equal to the total ion beam energy per charge (kinetic+potential energy) would result in ions barely reaching the substrate (i.e. a kinetic energy of 0 eV per charge for each ion). Setting the potential applied to the cryogenically-cooled carried substrate to x Volts below the total beam energy results in a kinetic energy of x eV per charge for each ion. For example, by setting the potential applied to the cryogenically-cooled carried substrate to 20 Volts below the total beam energy results in a kinetic energy of 20 eV per charge for each ion.

The method of the present invention is particularly advantageous for preparing samples of native proteins as protein conformation may be largely preserved during transfer onto the carrier substrate due to the careful control of the landing energy of the ions (the kinetic energy of the ions when received on the cryogenically-cooled carrier substrate).

In the following passages different aspects/embodiments are defined in more detail. Each aspect/embodiment so defined may be combined with any other aspect/embodiment or aspects/embodiments unless clearly indicated to the contrary. In particular, any feature indicated as being preferred or advantageous may be combined with any other feature or features indicated as being preferred or advantageous.

The step of decelerating the gas phase ions may reduce the kinetic energy of each of the gas phase ions to be less than 10 eV, preferably less than 5 eV, more preferably less than 3 eV per charge when received at the cryogenically-cooled carrier substrate.

The steps of generating gas phase ions may be performed at atmospheric pressure. The step of receiving the gas phase ions on the cryogenically-cooled carrier substrate may be performed under vacuum. The step of decelerating the ions may be performed under vacuum. Optionally the step of receiving ions is performed under a higher vacuum (i.e. lower pressure) than the step of decelerating the ions. Optionally the step of receiving the gas phase ions on the cryogenically-cooled carrier substrate is performed at a pressure of less than $10^{-3}$ mbar, preferably less than $10^{-4}$ mbar, more preferably equal to or less than a pressure of less than $10^{-5}$ mbar.

The carrier substrate is configured to support gas phase ions thereon. The carrier substrate may comprise a surface that is substantially transparent for electrons with a kinetic energy of 5 to 1000 eV.

The carrier substrate may be formed of any shape. The carrier substrate may be a TEM support carrier substrate. The carrier substrate may be formed of graphene, graphene oxide or amorphous carbon, such as thin or ultrathin amorphous carbon. The carrier substrate may be formed as a mesh or grid. The carrier substrate may be planar. The carrier substrate may be one of a plurality of carrier substrates. The gas phase ions of the one or more molecule(s) may at least partially neutralize at the surface of the cryogenically-cooled carrier substrate to form the sample, which comprises the one or more molecule(s) in a frozen state. The sample preferably consists of the one or more molecule(s) in a frozen state.

The electrospray ionisation performed may be native electrospray ionisation.

The method may further comprises filtering the gas phase ions according to their mobility or m/z ratio after their generation and before they are received on the cryogenically-cooled carrier substrate. Filtering of the gas phase ions may lead to improved resolution during imaging as the filtering may be performed to generate more homogeneous samples. For example, by filtering gas phase protein ions according to their mobility, this may result in gas phase ions filtered according to their conformity and/or shape. This is particularly advantageous as gas phase protein ions may contain a variety of conformational and ligand bound states, oligomers, aggregates and fragments that would otherwise limit resolution. Indeed, by filtering the gas phase protein ions according to their mobility, this may form a sample that is homogeneous with regard to protein conformation and so enabling conformation-selective imaging.

The method may further comprising analysing the gas phase ions before they are received on the cryogenically-cooled carrier substrate. Optionally, the gas phase ions may be analysed after they have been filtered and before they are received on the cryogenically-cooled carrier substrate. Accordingly, the analysis performed may be used to verify the selection of gas phase ions by the filter. The analysis may be performed by a mass analyser.

The step of receiving the gas phase ions of the one or more molecule(s) on the cryogenically-cooled carrier substrate may be performed under an atmosphere having a temperature of less than 250K, preferably less than 150 K, more preferably less than 80 K. Accordingly, the cryogenically-cooled carrier substrate remains cryogenically cooled during deposition of ions thereon thereby avoiding the need for plunge cooling of the sample. The cryogenically-cooled carrier substrate also reduces thermal motion of the gas phase ions received thereon.

The gas phase ions may be charged gas phase molecules. The one or more molecules may be single molecules. The one or more molecule(s) may be proteins, optionally wherein each protein is in one of their native states.

By way of example, the first molecule may be a first protein and the second molecule may be a second protein. The first molecule may be a first protein and the second molecule may be a complex of the first protein and a ligand. The first molecule may be a first protein in a first native state and the second molecule may be a first protein in a second native state. The first molecule may be a complex of a first protein and a first ligand and the second molecule may be a complex of a first protein and a second ligand.

In a first aspect, the method may further comprise injecting a matrix-forming fluid before the step of receiving the gas phase ions on the cryogenically-cooled substrate, wherein the matrix-forming fluid is received at the cryogenically-cooled carrier substrate before or during the step of receiving the gas phase ions on the cryogenically-cooled carrier substrate and forms a matrix around the sample. As discussed above, the sample is formed by freezing of the gas phase ions of one or more molecule(s) at the surface of the cryogenically-cooled carrier substrate. Accordingly, the sample comprises the one or more molecule(s) in a frozen state.

In addition or in an alternatively, the matrix-forming fluid may be injected after the step of receiving the gas phase ions on the cryogenically-cooled substrate.

The matrix-forming fluid may be injected into the path of the gas phase ions such that the matrix-forming fluid is entrained with the gas phase ions.

By injection of a matrix-forming fluid in either the first or second embodiments, the matrix forms on and around the ions. The matrix may mitigate damage on landing of the gas phase ions on the cryogenically cooled substrate by providing additional degrees of freedom to dissipate the landing energy (the kinetic energy of the ions when received on the cryogenically-cooled grid). The matrix may also mitigate damage otherwise caused by the electron beam during imaging the ions. Where the ions are protein ions, the injection of the matrix-forming fluid may therefore reduce or avoid heterogeneity that may otherwise be introduced in the secondary and tertiary structure due to dehydration, landing, and surface interactions of the ions.

The matrix-forming fluid is capable of freezing or solidifying or crystallising under the cryogenic conditions of the cryogenically-cooled carrier substrate to therefore form the matrix. The matrix-forming fluid may comprise a liquid and/or a gas. The matrix-forming fluid may comprise or be a vaporised solvent. The matrix-forming fluid may condense, freeze or crystallise or solidify on impact with the cryogenically-cooled carrier substrate. The term matrix refers to a species or component that is not the sample of one or more molecule(s).

The matrix may be a protective species that is formed around, and/or on, the sample formed when the gas phase ions are received on the cryogenically-cooled carrier substrate.

The flow rate of injection of the matrix-forming fluid and/or the partial pressure of the matrix-forming fluid in the atmosphere surrounding the cryogenically-cooled carrier substrate and/or the temperature of the atmosphere surrounding the cryogenically-cooled carrier substrate may be controlled to control the thickness of the matrix formed. Optionally, the partial pressure and/or the flow rate of injection of the matrix-forming fluid and/or the temperature of the atmosphere surrounding the cryogenically-cooled carrier substrate may be controlled such that the thickness of the matrix is similar, optionally the same as, the thickness of the sample formed. This is advantageous as any additional thickness would decrease the signal-to-noise ratio when imaged with a cryo-electron microscope. Optionally, the flow rate of injection of the matrix-forming fluid and/or the temperature of the atmosphere surrounding the cryogenically-cooled carrier substrate and/or partial pressure of the atmosphere surrounding the cryogenically-cooled carrier substrate may be controlled such that matrix forms a continuous layer, preferably of uniform thickness.

The matrix may therefore be formed as a layer of controlled thickness. This is in contrast to known arrangements where a layer of ice of potentially irregular thickness in which the ions are embedded is formed thereby reducing resolution of the subsequent imaging performed.

The temperature of the atmosphere surrounding the cryogenically-cooled carrier substrate and/or the partial pressure of the matrix-forming fluid in the atmosphere surrounding the cryogenically-cooled carrier substrate may be controlled such that the rate of condensation of the matrix-forming fluid on the cryogenically-cooled carrier substrate is greater than the rate of sublimation from the cryogenically-cooled carrier substrate such that the layer of matrix-forming fluid on the cryogenically-cooled carrier substrate increases over time.

The matrix may sublime after the step of receiving ions on the cryogenically-cooled carrier substrate and before imaging the sample using a cryo-electron microscope. For example, after the step of receiving ions on the cryogenically-cooled carrier substrate and before imaging the sample using a cryo-electron microscope, the temperature of the atmosphere surrounding the cryogenically-cooled carrier substrate and/or the partial pressure of the matrix-forming fluid of the atmosphere surrounding the cryogenically-cooled carrier substrate may be controlled such that the rate of condensation of the matrix-forming fluid is less than the rate of sublimation such that the matrix sublimes. Consequently, the matrix may protect and immobilises the ions on landing on the carrier substrate and during transportation of the sample without interfering with imaging of the sample.

The matrix-forming fluid may be water vapour and the matrix formed on the carrier substrate may be ice. Alternatively, the matrix-forming fluid may comprise an inert gas, preferably wherein the inert gas comprises one or more of Ar, Kr, Ne, $H_2$. The inert gas may condense or freeze on the carrier substrate forming the matrix around the particles.

The matrix-forming fluid may comprise self-assembled monolayers, and so the matrix formed may comprise self-assembled monolayers, for example a thin film of self-assembled monolayers.

The method may comprise, before the step of generating ions, a step of receiving a solution comprising the one or more molecule(s) dissolved in a solvent and optionally the step of generating gas phase ions may comprise generating one or more charged gas-phase molecule(s) comprising a solvation shell. The one or more molecule(s) may be charged when dissolved in the solvent.

The solvation shell may be referred to as a hydration shell and describes the arrangement where solvent molecules are arranged around the gas phase ion. The solvent may be water and so each gas phase ion may be surrounded by water molecules. In other words, the gas phase ions may be hydrated.

The solvation shell condenses or freezes on impact with the cryogenically-cooled carrier substrate thereby providing a sample where the gas phase ions are surrounded by the frozen solvent. Accordingly, the frozen solvent does not form a continuous layer but is non-continuous. This is advantageous as the frozen solvent protects the gas phase ions during imaging, but as the frozen solvent is only present around the ions rather than as a continuous layer, does not significantly reduce the signal to noise ratio during imaging.

In a second aspect, the method may comprise controlling the temperature of the atmosphere in which the steps of receiving the gas phase ions on the cryogenically-cooled carrier substrate and decelerating the ions may be performed and/or the partial pressure of solvent of the atmosphere in which the steps of receiving the gas phase ions on the cryogenically-cooled carrier substrate and decelerating the ions may be performed so that the solvation shell is retained when each charged gas-phase molecule is received on the cryogenically-cooled carrier substrate.

The method may further comprise controlling the temperature of the atmosphere in which the steps of decelerating the gas phase ions and receiving the ions on the cryogenically-cooled carrier substrate may be performed and/or the partial pressure of solvent of the atmosphere in which the steps of decelerating the gas phase ions and receiving the ions on the cryogenically-cooled carrier substrate may be performed such that the rate of sublimation is less than the rate of condensation of the solvent. Consequently, evaporation of the solvation shell during the steps of decelerating the gas phase ions and receiving the ions on the cryogenically-cooled carrier substrate may be prevented.

For example, where the solvent is water, the steps of decelerating the gas phase ions and receiving the ions on the cryogenically-cooled carrier substrate may be performed under an atmosphere having a partial pressure of water of greater than $1 \times 10^{-10}$ mbar and a temperature of less than 130K, preferably less than 100K. Preferably, the steps of decelerating the gas phase ions and receiving the ions on the cryogenically-cooled carrier substrate may be performed under an atmosphere having a partial pressure of water between $1 \times 10^{-10}$ mbar and $1 \times 10^{-7}$ mbar and a temperature of less than 100K.

The temperature may be controlled to be less than 250K, preferably less than 150 K, more preferably less than 80 K.

It is possible to combine the features of the first and second aspects (i.e. employing gas phase ions comprising a solvation shell and also injecting in a matrix-forming fluid before and/or after receiving the gas phase ions on the cryogenically-cooled carrier substrate).

In a third aspect, the method may comprise controlling the temperature of the atmosphere in which the step of receiving the gas phase ions on the cryogenically-cooled carrier substrate is performed and/or the partial pressure of solvent of the atmosphere in which the step of receiving the gas phase ions on the cryogenically-cooled carrier substrate is performed such that the rate of sublimation is greater than the rate of condensation of the solvent. In such an arrangement, ice-growth on the sample may be avoided. The solvent may be water.

The method may comprise controlling the temperature of the atmosphere in which the step of receiving the gas phase ions on the cryogenically-cooled carrier substrate (and optionally also the step of decelerating the ions) may be performed and/or the partial pressure of water of the atmosphere in which the step of receiving the gas phase ions on the cryogenically-cooled carrier substrate (and optionally also the step of decelerating the ions) may be performed such that the rate of ice growth on the cryogenically-cooled substrate is less than one monolayer per hour, optionally the rate of ice growth on the cryogenically-cooled substrate may be substantially zero. The term monolayer used in this specification refers to a gap-free layer of molecules having a thickness of one molecule. The step of receiving the ions on the cryogenically-cooled carrier substrate may be performed under an atmosphere having a partial pressure of water of less than $1 \times 10^{-8}$ mbar and a temperature of greater than 80 K, more preferably greater than 100 K, most preferably greater than 110 K. Preferably, the step of receiving the ions on the cryogenically-cooled carrier substrate may be performed under an atmosphere having a partial pressure of water of less than $1 \times 10^{-10}$ mbar and a temperature of greater than 130 K.

Optionally, the gas phase ions received at the carrier substrate may be free of water vapour. For example, if the gas phase ions are generated with a solvation shell, then the solvation shell may be evaporated during deceleration of the ions towards to the cryogenically-cooled carrier substrate and/or during the step of receiving the ions on the cryogenically-cooled carrier substrate due to the reduced partial pressure of the solvent and/or increased temperature in the atmosphere in which the step of deceleration of the ions and/or the step of receiving the ions on the cryogenically-cooled carrier substrate are performed. Consequently, the gas phase ions may be received on the carrier substrate without frozen solvent or matrix being formed. For example, if gas phase ions are generated with a solvation shell containing water molecules, then the partial pressure of water within the atmosphere surrounding the cryogenically-cooled carrier substrate may be reduced so that the solvation shell is evaporated during deceleration of the ions towards the carrier substrate and/or during receiving the ions on the cryogenically-cooled carrier substrate and consequently no ice may be formed on receiving the gas phase ions on the carrier substrate.

The temperature of the atmosphere of the cryogenically-cooled substrate may be less than 250K, preferably less than 175 K, at which the cryogenically-cooled substrate remains cryogenically cooled and thermal motion of the gas phase ions is suppressed.

By avoiding growth of ice or other frozen solvent by controlling the partial pressure of the solvent and/or the temperature of the atmosphere in which the step of receiving the gas phase ions on the cryogenically-cooled carrier substrate is performed, this may eliminate solvent related issues. These issues include the air-solvent interface strong and inhomogeneous background signal, unintentional devitrification, beam-induced motion of the ice, and inhomogeneous particle distribution. As discussed in respect of the data presented in this annex to this application, when substantially ice-free samples of native proteins are prepared and imaged, the proteins remain folded and the subunits remain attached to each other, despite this dehydration, collision with the substrate, and prolonged exposure to the substrate-vacuum interface at room temperature.

Accordingly, the inventors have discovered that solvent and ice related issues may be eliminated without damaging the molecules of the sample by controlling the temperature and/or partial pressure of solvent in the atmosphere in which the step of receiving the gas phase ions on the cryogenically-cooled carrier substrate is performed. This aspect may therefore be particularly advantageous for preparing samples containing native proteins for imaging by cryo-EM.

The present invention also provides a method of imaging a sample of one or more molecules, the method comprising: the method of preparing a sample for a cryo-electron microscope in accordance with any of the embodiments discussed above; and imaging the sample by cryo-electron microscopy.

The step of imaging the sample by cryo-electron microscopy may be performed under vacuum in a cryo-electron microscope.

The method may further comprise maintaining the vacuum and/or maintaining the carrier substrate to be cryogenically cooled between the step of preparing the sample and the step of imaging the sample.

The method may further comprise shielding the cryogenically-cooled carrier substrate after the step of receiving the ions on the cryogenically-cooled carrier substrate.

In particular, shielding of the carrier substrate may comprise shielding the cryogenically-cooled substrate from contamination by, for example, water vapour, and from thermal radiation.

For any of the embodiments described above, the step of generating gas phase ions may be performed by an electrospray ion source, wherein before the step of generating ions, the method further comprises: arranging the carrier substrate in a holder; coupling the holder to a transfer rod; transferring the holder to an intermediate vacuum chamber via the transfer rod; pumping the intermediate vacuum chamber such that the intermediate vacuum chamber is under vacuum before connecting the intermediate vacuum chamber to a deposition chamber under vacuum; transferring the holder to the deposition chamber under vacuum via the transfer rod; and detaching the transfer rod from the holder once the holder is within the deposition chamber, wherein the deposition chamber is arranged such that the carrier substrate receives the ions generated by the electrospray ionisation source when positioned within the deposition chamber. The electrospray ion source may optionally form part of an electrospray mass spectrometer.

After the step of receiving the gas phase ions on the cryogenically cooled carrier substrate, the method may further comprise: coupling the holder to the transfer rod; pumping a movable chamber coupled to the intermediate vacuum chamber such that the movable chamber is under vacuum; transferring the holder under vacuum from the deposition chamber through the intermediate vacuum chamber and into the movable chamber via the transfer rod; de-coupling the movable chamber from the intermediate chamber; and moving the holder to the cryo-electron microscope while maintaining the carrier substrate to be cryogenically cooled.

These arrangements enable transportation of a carrier substrate within the holder while maintaining vacuum conditions to avoid contamination and maintaining the carrier substrate to be cryogenically cooled.

The intermediate chamber may be a load lock chamber.

The step of moving the holder to the cryo-electron microscope may comprise moving the holder to a loading station via the movable chamber, extracting the holder from the movable chamber within the loading station and transferring the holder to the cryo-electron microscope.

Alternatively, the step of moving the holder to the cryo-electron microscope comprises moving the holder via the movable chamber under vacuum to the cryo-electron microscope.

The holder may form part of a module. The holder may be indirectly coupled to the transfer rod via the module.

The present invention also provides an apparatus for preparing a sample of one or more molecule(s) for a cryo-electron microscope, the apparatus comprising: an electrospray ionisation source configured to generate gas phase ions of the one or more molecule(s); one or more ion optic device(s) configured to guide the gas phase ions of the one or more molecule(s) from the electrospray ionisation source towards a deposition chamber; a voltage supply configured to apply a potential to a carrier substrate to receive the gas phase ions generated by the electrospray ionisation mass spectrometer; a cryogenic cooling system configured to cryogenically cool a carrier substrate; and a controller configured to control the voltage supply to apply a potential to a cryogenically-cooled carrier substrate such that the gas phase ions generated by the electrospray ionisation mass spectrometer are decelerated to an energy of less than 20 eV when received at a cryogenically-cooled carrier substrate.

The apparatus may further comprise a holder configured to receive a carrier substrate. The holder may form part of module. At least a part of the holder in contact with the carrier substrate may be formed of a thermally conductive and electrically conductive material.

The apparatus may further comprising a shielding mechanism, the shielding mechanism comprising the holder, the shielding mechanism configured to be arranged in a shielded configuration in which the carrier substrate within the holder is shielded and an exposed configuration in which a carrier substrate within the holder is exposed.

The shielding mechanism may further comprise a shield, wherein, in the shielded configuration, the shield is arranged to cover a carrier substrate within the holder and, in the exposed configuration, the shield is arranged such that it does not cover a carrier substrate within the holder. The shield may cover the surface of a carrier substrate within the holder on which the gas phase ions are received when in the shielded configuration, the other surfaces of the carrier substrate being covered by the holder. The surface of the carrier substrate on which the gas phase ions are received may be exposed (i.e. not covered by the shield) when in the exposed configuration.

The shield may be configured to shield a carrier substrate within the holder from thermal radiation and from contamination.

The shield may be formed of a thermally insulative material thereby shielding the carrier substrate within the holder from thermal radiation.

The shield may be rigid such that it does not deform during normal use.

The shielding mechanism may be moveable from the shielded configuration to the exposed configuration by relative movement between the shield and the holder. For example, the shield may move relative to the holder to cover the carrier substrate in the shielded configuration and may move relative to the holder to un-cover the carrier substrate.

The shielding mechanism may comprise a push element configured to push the holder and/or the shield into the exposed configuration. The push element may be, for example, a pin or a protrusion.

The apparatus may comprise an electrical contact element configured to electrically couple the voltage supply to a carrier substrate within the holder.

The push element may be arranged to contact the holder when the shielding mechanism is in the exposed configuration and may be formed of an electrically conductive material such that the push element electrically couples the voltage supply to the carrier substrate via the holder. The push element may therefore be the electrical contact element configured to electrically couple the voltage supply to a carrier substrate within the holder.

The shielding mechanism may further comprise a biasing element configured to bias the holder and/or the shield into the shielded configuration. The biasing element may be a spring or other resiliently deformable material.

The push element may be configured to push the holder and/or the shield into the exposed configuration against the biasing force of the biasing element.

The electrical contact element, which may be the push element, may be configured so that when the shielding mechanism is in the shielded configuration, the electrical contact element does not contact the holder. Consequently, electrical contact between the holder and the voltage supply may only be provided when the shielding mechanism in the exposed configuration (i.e. when the carrier substrate is exposed). In other words, a potential may only be applied to the carrier substrate when the carrier substrate is exposed (i.e. not covered by the shield).

The shielding mechanism (i.e. the holder and the shield) may form part of a module configured to house the carrier substrate, wherein the module may be moved between the deposition chamber and a cryo-electron microscope. The module may be received within the deposition chamber for receiving gas phase ions generated by the electrospray ionisation source on a carrier substrate within the holder of the module under vacuum conditions. The module may be removed from the deposition chamber and received within and/or coupled to a cryo-electron microscope for imaging the gas phase ions deposited on the carrier substrate within the holder.

The apparatus may further comprise a filter configured to filter the gas phase ions according to their mobility or m/z ratio after their generation and before they are received on the cryogenically-cooled carrier substrate.

The apparatus may further comprise a mass analyser configured to analyse the filtered gas phase ions before they are received on the cryogenically-cooled carrier substrate. Accordingly, the analysis performed may be used to verify the selection of gas phase ions by the filter.

The apparatus may further comprise a cryo-electron microscope configured to image the sample.

The apparatus may further comprise a carrier substrate.

BRIEF DESCRIPTION OF FIGURES

FIG. 4($b$) is a perspective view of the module comprising the shielding mechanism in the shielded configuration in accordance with an exemplary embodiment of the invention.

FIG. 6 ($b$) is a schematic cross sectional view of the module when arranged within the support of the deposition chamber of the apparatus and with the shielding mechanism in the exposed configuration in accordance with an exemplary embodiment of the invention.

FIGS. 11 to 18 depict experimental data taken from Tim K. Esser et al., Mass-selective and ice-free cryo-EM protein sample preparation via native electrospray ion-beam deposition, https://doi.org/10.1101/2021.10.18.464782, which is hereby incorporated by reference and discussed in the experimental data section of this application.

FIG. 11($a$) is a room-temperature TEM micrograph of ferritin, deposited on a home-made graphene oxide film. Particles are found mainly in areas with thick GO film (left side). FIG. 11($b$) is a room-temperature TEM micrograph of ferritin on a 3 nm amorphous carbon film under identical deposition and imaging conditions, demonstrating a clean sample with homogeneous particle density.

FIGS. 12($a$), ($d$), ($g$) and ($i$) are unfiltered raw cryo-EM micrographs of native ice-free ES-IBD samples of apo-/holo-ferritin, GroEL, ADH, and β-gal, respectively. Panels beneath the micrographs (i.e FIGS. 12($b$), ($c$), ($e$), ($f$), ($h$) and ($j$)) show, from left to right, 3D models from the PDB (PDB 3D), 2D classes from plunge-frozen cryo-EM samples from the literature (LIT 2D), and 2D classes (IBD 2D) and representative single particles (IBD SP) form ice-free native ES-IBD samples. FIGS. 12($b$) and ($c$) show apo- and holo-ferritin, FIGS. 12($e$) and ($f$) show GroEL top and side views, and FIGS. 12($h$) and ($j$) show ADH and β-gal.

FIGS. 13($a$) and ($b$) show unfiltered EM micrographs, FIGS. 13($c$) and ($d$) s EM micrographs how band-pass filtered between 10 and 200 Å, FIGS. 13($e$) and ($f$) show representative 2D classes and FIGS. 13($g$) and ($h$) show 3D EM density maps for a native ES-IBD and a plunge frozen control sample of β-gal, respectively. The number of particles is indicated in the panels.

FIG. 14($a$) is a detailed view of the diamond-shaped class from the ice-free ES-IBD β-gal sample. FIG. 14($b$) is the same view with increased contrast and reduced brightness to highlight characteristic internal features. FIG. 14($c$) is the same view with marked features, including eight characteristic density maxima (labelled with numeral (i)), four minima around the center (labelled with numeral (iii)), and eight minima at the tips (labelled with numeral (ii)). Arrows indicate edges with lower contrast. All features agree qualitatively with the reference class FIG. 14($d$), obtained from the RELION 3.0 tutorial data set.

FIG. 15 includes 3D EM density maps of the native ES-IBD sample of β-gal. The panels indicate if no symmetry (C1) or dihedral symmetry (D2) was applied during the 3D auto-refine step in RELION. FIGS. 15($a$) and ($b$) show structures that were obtained using all 50,000 particles while FIGS. 15($c$) and ($d$) were generated using a subset of 16,400 particles. FIGS. 15($e$), 15($f$), 15($g$), and 15($h$) in the second row of FIG. 15 show cross-sections of the structures in the first row.

FIG. 16A is a 3D structure from β-gal control sample in ice, obtained using the same solution as for the native ES-IBD samples (200 mM ammonium acetate pH 6.9), and FIG. 16B is an image of an enlarged portion of the β-gal control sample.

FIGS. 17A through 170 depicts non-activating, native mass spectra of apo-/holo-ferritin (17A), GroEL (17B), ADH (17C), and β-gal (17C). For native ES-IBD experiments, native oligomers were mass selected, i.e., tetramer for ADH and β-gal and tetradecamer for GroEL. Both apo- and holo-ferritin were selected and deposited at the same time.

FIGS. 18A and 18B include 3D EM density maps for ice-free ES-IBD β-gal sample obtained using C1 symmetric in RELION's automated refinement. FIG. 18A is a map obtain using a subset of 50,000 particles showing localized deformation. FIG. 18B is a 3D EM density maps for ice-free ES-IBD β-gal sample obtained from a subset of 16,400 particles, after multiple 2D and 3D classification steps, showing significantly less deformation.

DETAILED DESCRIPTION

Figure 1:
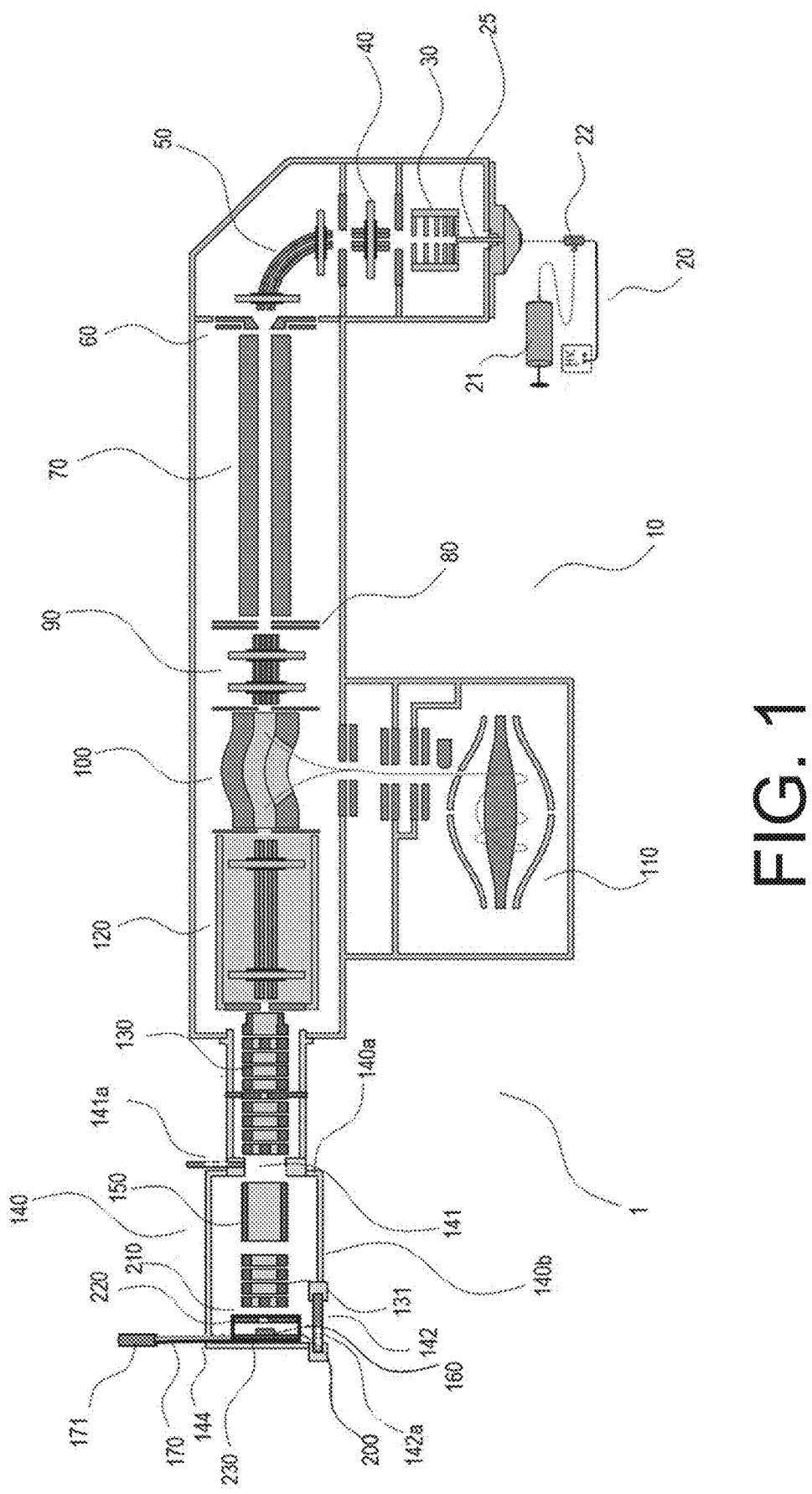
FIG. 1 is a schematic diagram of an apparatus in accordance with an exemplary embodiment of the present invention.

FIG. 1 shows a schematic arrangement of a sample preparation apparatus 1 suitable for carrying out a method of preparing a sample of one or more molecule(s) for imaging with a cryo-electron microscope in accordance with embodiments of the present invention. The apparatus comprises an ion source 20 which generates gas-phase ions to be analysed.

The ion source 20 is an electrospray ionisation source at atmospheric pressure. As shown in FIG. 1, the ion source 20 is preferably a native electrospray ionisation source. The native electrospray ionisation source 20 may comprise an emitter 22 having a charged tip that generates the gas phase ions. The native electrospray ionisation source 20 may be an online source comprising a syringe pump 21 configured to pump a solution of the one or more molecule(s) into the emitter 22. Alternatively, the native electrospray ionisation source 20 may be an offline source (i.e. without a syringe pump).

The apparatus 1 comprises one or more ion optic device(s) configured to transport the ions from the electrospray ionisation source 20 to a deposition chamber 140 under vacuum. The ion optic devices are arranged within a guiding chamber 10 that is under vacuum.

In the exemplary embodiment shown in FIG. 1, the ion optic device(s) and electrospray ionisation source 20 form part of a mass spectrometer also comprising a mass analyser 110. The ion optic device(s) are similar those employed in Thermo Fisher Scientific, Inc's QExactive® quadrupole-Orbitrap® mass spectrometer and comprise a capillary 25, an S-lens 30, an injection flatapole 40, a bent flatapole 50, an ion gate 60, a quadrupole mass filter 70, an exit lens/split lens arrangement 80, a transfer multipole 90, a C-trap 100, and an ion routing multipole 120. However, in other embodiments, other ion optic device(s) in alternative configurations may be used to transport ions from the ion source 20 to a deposition chamber 140.

The ion optic devices may be under the control of a controller (not shown) which, for example, is configured to control the timing of ejection and trapping voltages and to set the appropriate potentials on the electrodes of the ion optics devices so as to focus, filter and guide the ions.

In the specific arrangement shown in FIG. 1, the ions generated by the ion source 20 are directed by a capillary 25 into an S-lens 30. The capillary may have an internal diameter of greater than 0.5 mm, such as greater than 0.7 mm, preferably 0.75 mm to increase transmission.

The S-lens 30 is also known as the stacked ring ion guide (SRIG) or the RF Lens. The application of RF amplitudes to the S-lens 30 establishes an RF field that confines and focusses ions as they traverse the S-lens 30. The S-lens 30 may have an aperture of greater than 1 mm, preferably greater than 2 mm, preferably 2.5 mm to increase transmission. The ions are focussed into an injection flatapole 40 which injects the ions into a bent flatapole 50. The bent flatapole 50 guides (charged) ions along a curved path through it whilst unwanted neutral molecules such as entrained solvent molecules are not guided along the curved path and are lost.

A TK lens 60 is located at the distal end of the bent flatapole 50. Ions pass from the bent flatapole 50 into a quadrupole mass filter 70. The quadrupole mass filter 70 can be operated with a mass selection window such that the quadrupole mass filter 70 extracts only those ions within a desired mass selection window that contains ions having those m/z ratios of interest (i.e. a window that contains the isotopes of interest). The mass filter is typically but not necessarily segmented and serves as a band pass filter. In some modes of operation, the quadrupole mass filter 70 may be operated in a substantially RF-only mode, so as to transmit as wide a mass range of ions as possible. This is used, for example, when a "full scan" is desired and the mass range should be as wide as possible. Although the apparatus is described in this exemplary embodiment as having a quadrupole mass filter and so filtering ions according to their m/z ratio, the quadrupole mass filter could instead be replaced with a filter configured to filter gas phase ions according to their mobility. For example, where the gas phase ions are ionised proteins in one of their native states, Thermo Scientific™ FAIMS Pro™ interface may be used to filter the gas phase ions according to their mobility. Alternatively, a linear drift tube may be used to filter the gas phase ions according to their mobility. The linear drift tube may be located proximal to the ion source 20. As the mobility of protein ions depends on their shape and/or conformity, by filtering gas phase ions according to their mobility, this achieves filtering of the protein ions according to their shape and/or conformation.

The filtered ions then pass through a quadrupole exit lens/split lens arrangement 80 that controls the passage of ions into a transfer multipole 90. The transfer multipole 90 guides the mass filtered ions from the quadrupole mass filter 70 into an ion trap, which is a curved trap (C-trap) 100. The C-trap 100 has longitudinally extending, curved rod electrodes which are supplied with RF voltages having RF trapping amplitudes, and end lenses to which DC voltages are supplied. The result is a potential well that extends along the curved longitudinal axis of the C-trap 100. The C-trap 100 stores ions in a trapping volume through application of the RF trapping amplitude to the rod electrodes (typically quadrupole, hexapole or octupole). In other words, the C-trap 100 can operate in an "RF only mode" for storage of ions i.e. there is no DC offset between the RF voltages. In some modes of operation, a small DC offset could be applied to the rod electrodes. In some embodiments, the C-trap may be replaced with a rectilinear ion trap having straight, longitudinally extending electrodes.

Optionally, the apparatus comprises a mass analyser 110 configured to analyse the gas phase ions received from the C-trap 100. In an apparatus where the filter 70 is present, which is optionally a quadrupole mass filter 70 in the exemplary embodiment of FIG. 1, the mass analyser 110 may be used to verify the selection of gas phase ions performed by the filter 70.

In the arrangement shown in FIG. 1, the mass analyser 110 is optionally an orbital trapping mass analyser 110, such as the Orbitrap® mass analyser sold by Thermo Fisher Scientific, Inc. The orbital trapping mass analyser 110 has an off-centre injection aperture and the cooled ions residing towards the bottom of the potential well of the C-trap 100 are injected into the orbital trapping device 110 as coherent packets, through the off-centre injection aperture as coherent packets. Ions are then trapped within the orbital trapping device 110 by a hyperlogarithmic electric field, and undergo orbital motion in coherent packets around an inner electrode. As will be understood by the skilled person, ion packets are detected through image currents and a mass spectrum is then obtained by fast Fourier transform.

Also shown in FIG. 1 is an ion routing multipole 120. The ions that leave the quadrupole mass filter 70 are injected through the C-trap 100 into the ion routing multipole 120.

Ions within the ion routing multipole 120 may be thermalized at a pressure between $10^{-1}$ and $10^{-3}$ mbar, preferably at a pressure of approximately $10^{-2}$ mbar, and a potential of between $-2$ and $-8$V, preferably at a potential of approximately $-5$V and then guided through a first set of steering lenses 130 into the deposition chamber 140, which may be at a pressure of less than $10^{-4}$ mbar, preferably at a pressure equal to or less than $10^{-5}$ mbar. The deposition chamber 140 and the ion optics are therefore all under vacuum and vacuum conditions are maintained while the ions are guided from the ion source 20 to the deposition chamber 140 by the ion optics.

The ion routing multipole 120 in use may be filled with a collision gas (e.g. helium or nitrogen) and consequently have a higher pressure than the C-trap 100. Control, and calibration of the accelerating potential experienced by the ions on entry to the ion routing multipole may be controlled to reduce the amount of unintentional dissociation occurring within the ion routing multipole 120.

The ion routing multipole 120 typically comprises a set of multipole rods which extend along the ion routing multipole 120, arranged about a central axis of the ion routing multipole. The multipole rods may be e.g. a quadrupole, a hexapole, or an octapole. The ion routing multipole 120 may also include a pair of end electrodes arranged at opposing ends of the set of multipole rods. RF potentials are applied to the set of multipole rods in order to form a pseudopotential field to confine ions along the central axis of the ion routing multipole 120. A DC potential may also be applied to the multipole rods such that the RF potentials are superimposed on the DC potential. In some embodiments, the ion routing multipole may include additional axial DC electrodes along the length of the ion routing multipole. The axial DC electrodes are configured to provide a plurality of DC voltages along the length of the multipole rods. The axial DC electrodes can be configured to provide an axially increasing, axially flat, or axially decreasing DC voltage profile along the length of the ion routing multipole. As such, the ion routing multipole includes a plurality of different voltages which may be controlled in order to control how ion are injected into, cooled within, and ejected from, the ion routing multipole. For example, the DC potential of the axial DC electrodes and/or the DC potential of the multipole rods may determine the accelerating potential experienced by the ions as they travel from the bent flatapole 50 and enter the ion routing multipole 120. The amount of acceleration experienced by the ions will affect the kinetic energy of the ions on entry to the ion routing multipole.

Ions may be stored in the ion routing multipole 120 through the application of a DC voltage that is applied to the axial ends of the ion routing multipole 120 (known as a trapping voltage), and also to the set of multipole rods. Application of the trapping voltage prevents ions from escaping from the ion routing multipole 120 to the C-trap when not desired. As such, the trapping potential controls the entry of ions into the ion routing multipole, as well as when ions are ejected from the ion trap.

In a first mode of operation, ions may be stored in the C-trap 100 and ejected to the mass analyser 110. The ions may then be analysed by the mass analyser and mass spectra generated to verify the filtration performed by the mass filter 70.

The controller may then switch the apparatus 1 to a second mode of operation by controlling the trapping voltages applied to the ion routing multipole 120 and the C-trap 100. In the second mode of operation, the ions may pass straight through the C-trap 100 directly into the ion routing multipole 120 and then into the deposition chamber 140 without trapping.

For transmission to the deposition chamber 140, ions stored in the C-trap 100 may be ejected (axially) into the ion routing multipole 120 and then ejected (axially) into the deposition chamber 140.

While the methods of the present invention typically do not involve fragmentation, it is contemplated that activation of the ions may be readily achieved within the mass spectrometer to image collision-energy specific fragments. In such arrangements, the ion routing multipole 120 may be configured to act as a fragmentation chamber that is configured to fragment precursor ions into fragment ions. The accelerating potential experienced by the ions on entry to the ion routing multipole 120 may be controlled such that the ions arriving into the ion routing multipole 120 may collide at high energy with gas molecules resulting in fragmentation of the ions into fragment ions. The fragment ions may then ejected from the ion routing multipole 120 back into the C-trap 100, where they are once again trapped and cooled in the potential well. Finally, the fragment ions trapped in the C-trap 100 may be ejected orthogonally towards the orbital trapping device 110 for analysis and detection.

The deposition chamber 140 is a vacuum chamber that may be pumped by a pump to reduce the pressure therein.

The deposition chamber 140 comprises an inlet 141 for ions to pass through formed in a front side 140a of the deposition chamber 140 perpendicular to a longitudinal direction. The longitudinal direction referred to herein is substantially aligned with, optionally parallel to, the direction of the movement of the gas phase ions into the inlet 141 and through the deposition chamber 140 in use. In this exemplary embodiment, the inlet 141 comprises an inlet aperture with a sealing surface around its periphery and a gate 141a configured to move between an open and closed configuration where in the closed configuration the deposition chamber is sealed and in an open configuration, the ions may pass into the deposition chamber. The inlet 141 may be formed as a gate valve. Alternatively, the inlet 141 may be formed as a port. The deposition chamber may be coupled to the guiding chamber 10 via the inlet 141. The aperture of the inlet may be sized to enable passage of ions therethrough. The deposition chamber may comprise a module-receiving portion 142 that is movable between an open configuration and a closed configuration. In this exemplary embodiment, the module-receiving portion 142 has a module-receiving aperture with a sealing surface around its periphery and a gate 142a configured to open and close to move the module receiving portion between the open configuration in which the module-receiving aperture is exposed and the closed configuration in which the module-receiving aperture is covered by the gate and so the deposition chamber is sealed. The module-receiving portion may be formed as a gate valve. The module-receiving aperture is sized to enable passage of the module therethrough. The module-receiving portion is optionally located on a side of the deposition chamber that extends parallel to the longitudinal direction so that movement of the module therethrough is perpendicular to the longitudinal direction. In the exemplary embodiment shown, the module-receiving portion 142 is located on a lower side 140b of the deposition chamber 140.

A set of steering lenses, referred to herein as the second set of steering lenses 131, may be provided within the deposition chamber 140 as shown in FIG. 1. The second set of steering lenses 131 may be provided between the inlet 141 and the support 145 described in detail below. Each set of steering lenses 130, 131 may be split into segments, preferably quadrants (upper, lower, left and right parts) that allow electrical steering of the gas phase ions. Each set of steering lenses 130, 131 may be formed as a cylinder. All segments of the respective set of steering lenses 130, 131 may be held at a common offset potential. To steer the beam, a small additional potential may be applied to the relevant segment of the set of steering lenses. For example, to steer the gas phase ions to the left, a small additional potential would be applied to the left segment.

The deposition chamber 140 may optionally further comprise an immersion lens 150 between the inlet and the carrier substrate 160. The immersion lens 150 shields the gas phase ions from the grounded walls of the deposition chamber 140 which could otherwise form a potential barrier.

Figure 5:
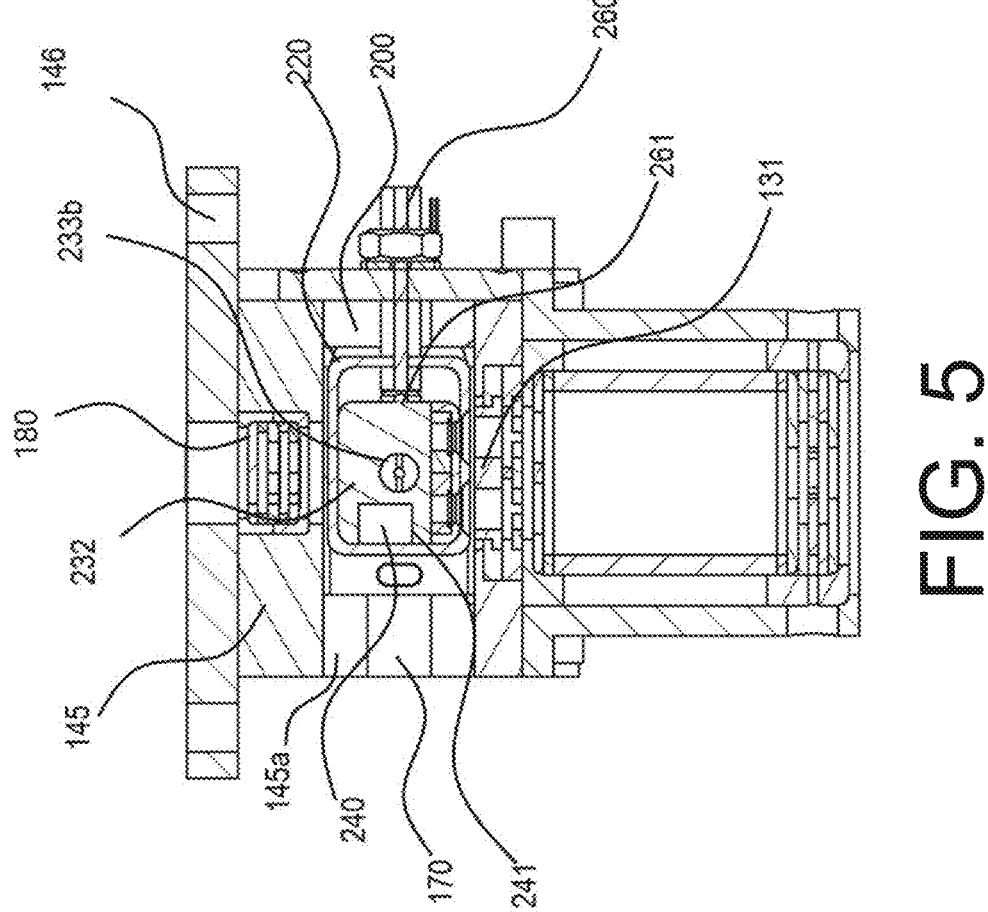
FIG. 5 is a schematic top sectional view of the module when arranged within a support of the deposition chamber of the apparatus in accordance with an exemplary embodiment of the invention.
Figure 7:
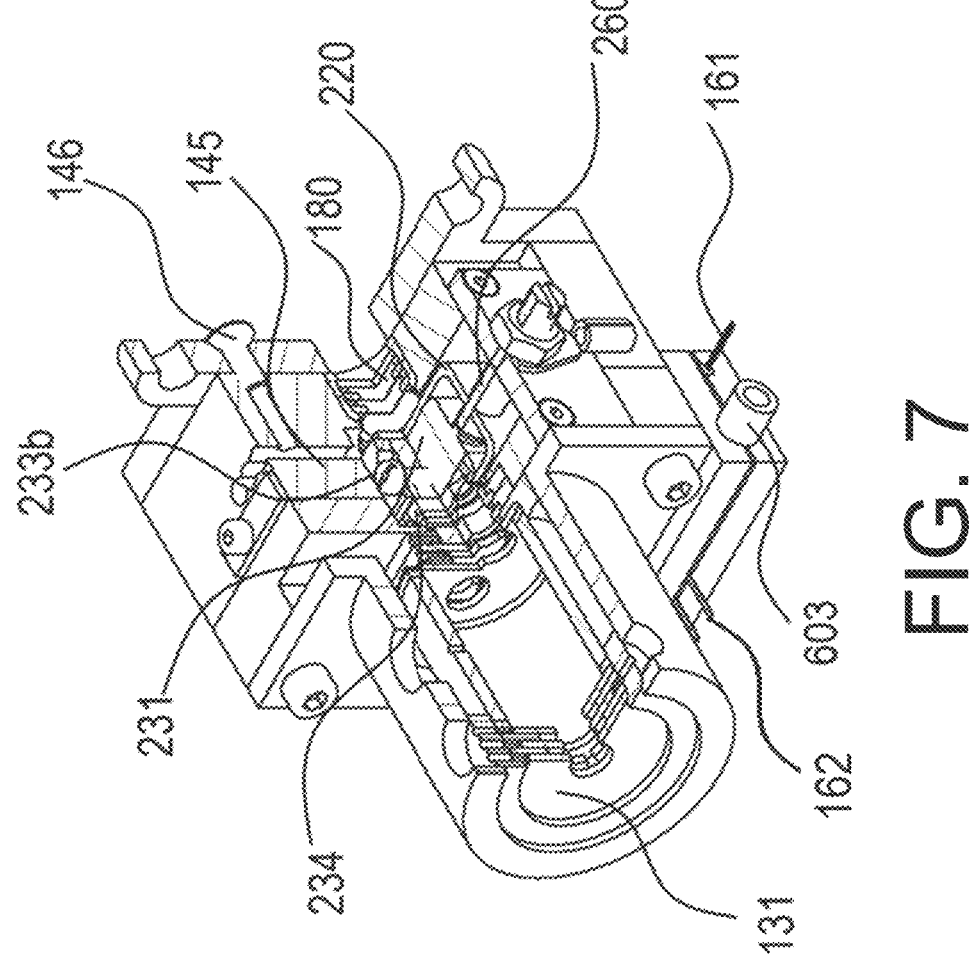
FIG. 7 is a schematic sectional view of the deposition chamber having the module arranged within the support of the deposition chamber.
Figure 8:
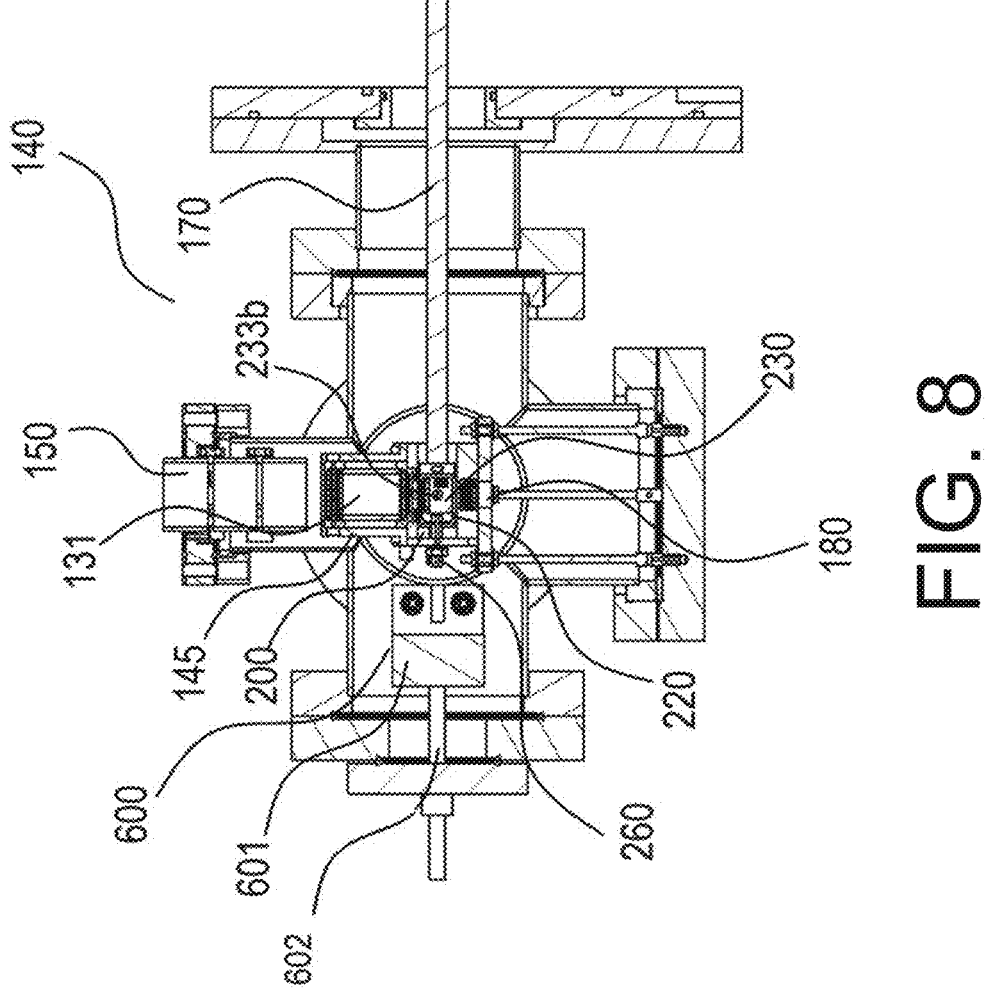
FIG. 8 is a schematic sectional view of the deposition chamber having the module arranged within the support of the deposition chamber.

The deposition chamber 140 may comprise a support 145, as shown in FIGS. 5, 7 and 8, configured to retain the module therein. The support 145 may also retain ion optics, such as the immersion lens 150 therein. In an arrangement where the steering lenses 130 are within the deposition chamber 140 rather than the guiding chamber 10, the support 145 may also be configured to retain the steering lenses 130 therein. The support 145 may be configured to align the module 200 with the ion optics retained therein, which may be the immersion lens 150 or the steering lenses 130. The support 145 may be configured to align the module 200 and optionally the ion optics retained therein with the inlet 141 of the deposition chamber 140. The support 145 may comprise a support body, which may be formed of an electrically and thermally conductive material, such as copper. The support body may comprise a channel 145a through which the module 200 may be moved therethrough. The support body may receive the ion optics present in the deposition chamber 140, such as the immersion lens 150, within a cavity formed in the support body 145, the cavity referred to herein as a lens cavity.

Figure 6A:
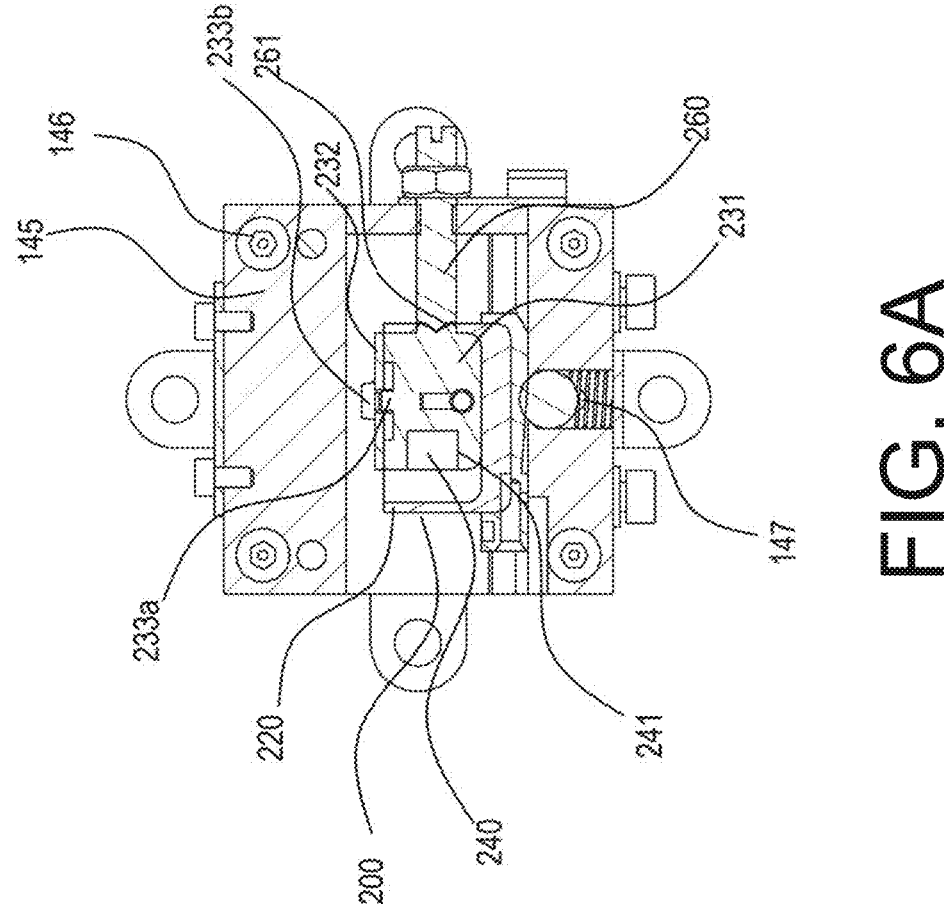
FIG. 6 ($a$) is a schematic cross sectional view of the module when arranged within the support of the deposition chamber of the apparatus and with the shielding mechanism in the shielded configuration in accordance with an exemplary embodiment of the invention.
Figure 6B:
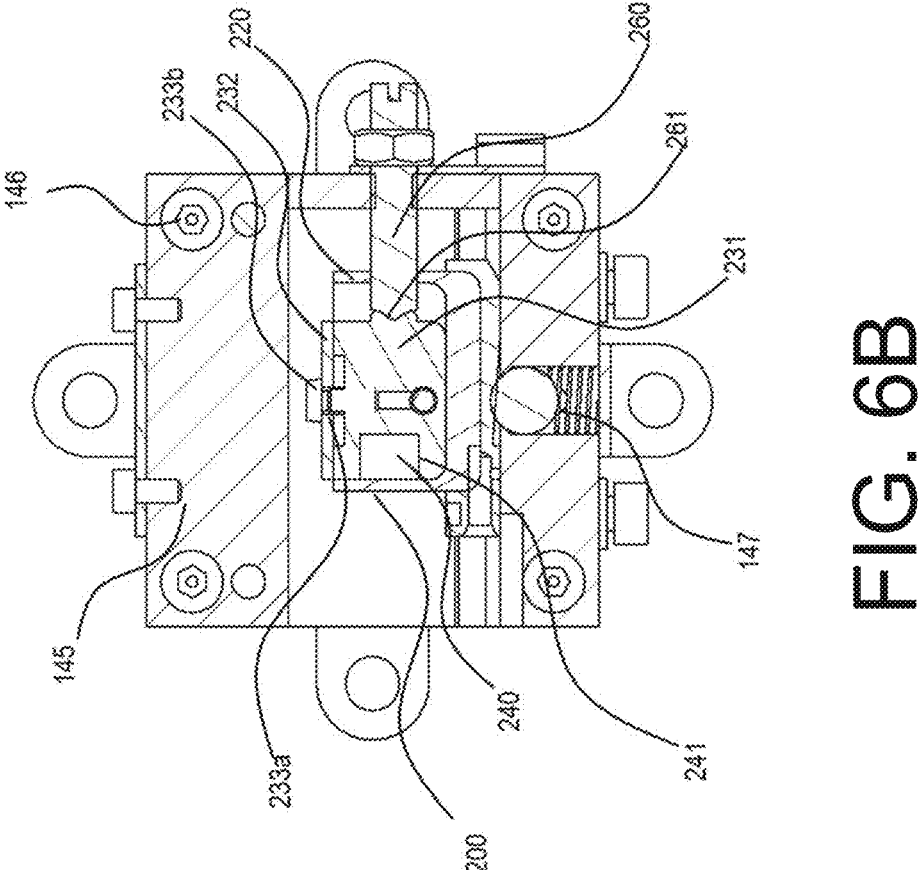

As best shown in FIGS. 5 and 7, the support 145 may comprise one or more alignment features 146 configured to align the module 200 within the support body such that the carrier substrate within the module is aligned with the inlet 141 of the deposition chamber 140. The alignment features 146 may comprise one or more rods. As best shown in FIGS. 6(a) and 6(b), the support 145 may comprise one or more fixing features 147 configured to fix the module 200 within the support body. The fixing features 147 may comprise a spring loaded ball, which may have a greater biasing force than the biasing element 240.

The apparatus may further comprise an injector (not shown) configured to inject a matrix-forming fluid into the deposition chamber 140 and/or the guiding chamber 10. The injector may be configured to inject the matrix-forming fluid into the stream of gas phase ions/ion beam. The injector may be fluidly coupled to a reservoir comprising the matrix-forming fluid, which may be water vapour. When present, the injector is positioned upstream of the module 200 containing the carrier substrate 160.

The deposition chamber 140 and/or the guiding chamber 10 may comprise the injector configured to inject a matrix-forming fluid into the stream of ions/ion beam. For example, the injector may be received through an injector port that may be provided within a wall of the deposition chamber 140 and/or guiding chamber 10. Alternatively, the injector may be contained within the deposition chamber 140 and/or guiding chamber 10.

Figure 3:
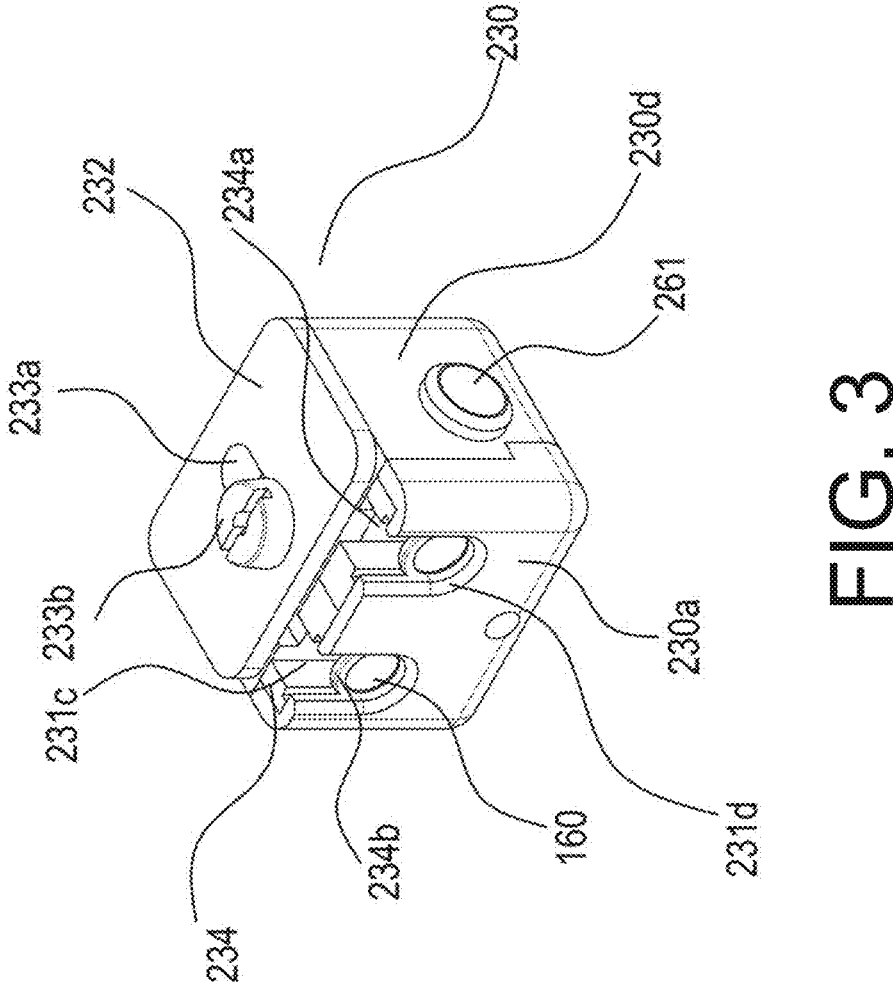
FIG. 3 is a schematic perspective view of a holder of the apparatus when assembled with a carrier substrate in accordance with an exemplary embodiment of the invention.
Figure 4A:
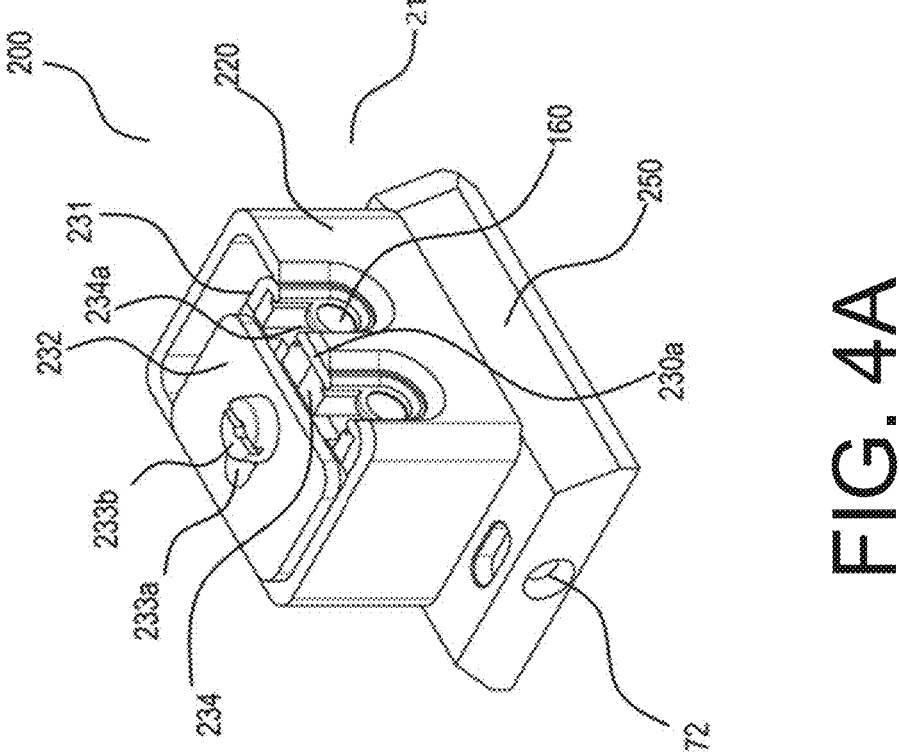
FIG. 4($a$) is a schematic perspective view of the module comprising a shielding mechanism in the exposed configuration in accordance with an exemplary embodiment of the invention.
Figure 4B:
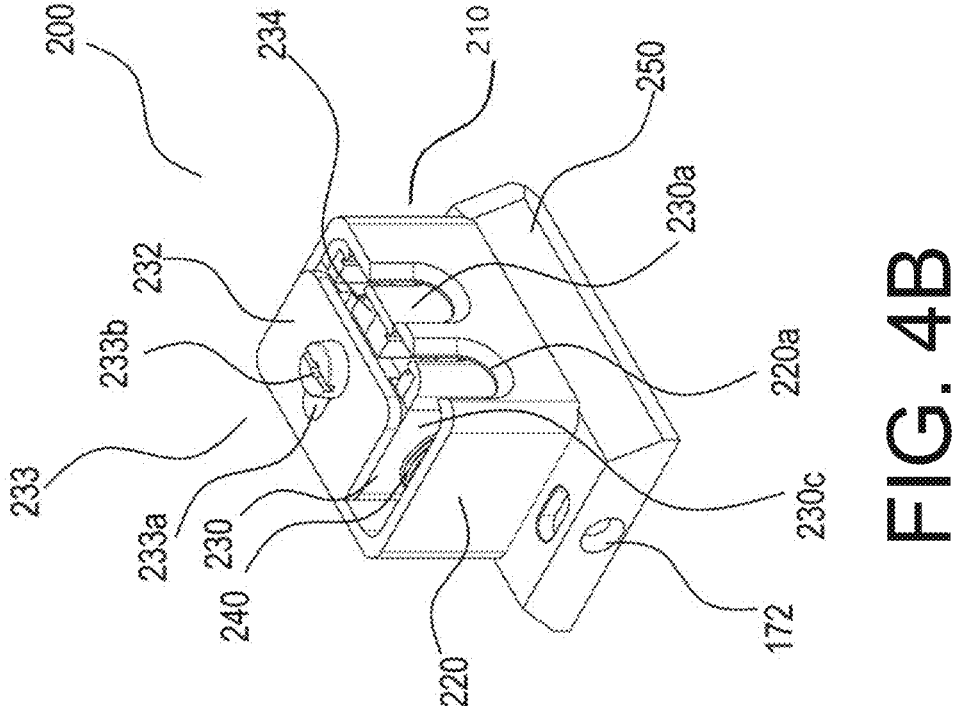

As shown in FIG. 4, the module 200 comprises a shielding mechanism 210. The shielding mechanism 210 comprises a shield 220 and a holder 230 configured to receive a carrier substrate 160. The carrier substrate 160 may be planar and formed as a mesh. The carrier substrate 160 may be formed of graphene, graphene oxide or thin amorphous carbon. The carrier substrate 160 has a front surface, which is a major surface for receiving ions thereon. In the exemplary arrangement shown in FIGS. 2, 3, 4(a) and 4(b), two carrier substrates 160 are employed that are disc shaped. However, other numbers of carrier substrate 160 and other shapes of carrier substrate 160 are contemplated in the present invention.

Figure 2:
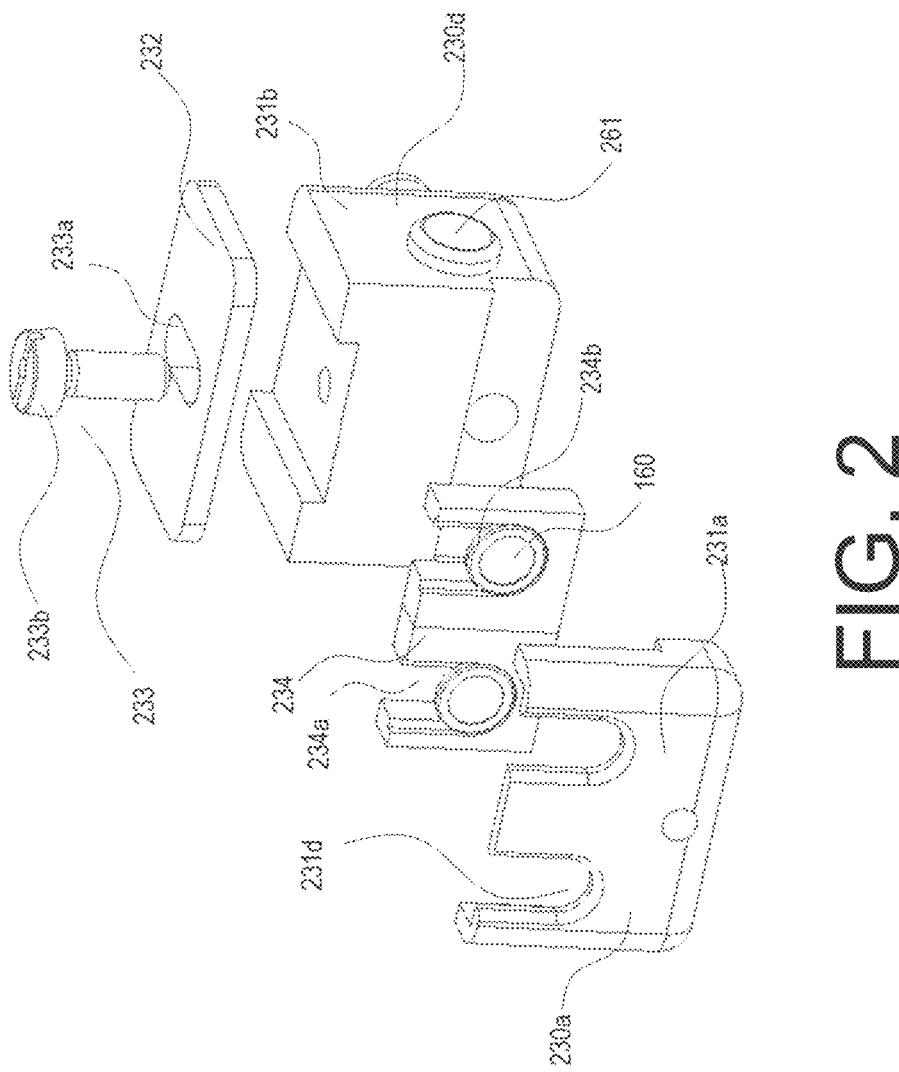
FIG. 2 is schematic exploded view of a holder of the apparatus in accordance with an exemplary embodiment of the invention.

As best shown in FIGS. 2 and 3, the holder 230 may comprise a block 231 having front and rear faces 230a, 230b spaced apart from each other along the longitudinal direction and lateral faces 230c, 230d spaced apart from each other in transverse directions. The front face 230a opposes the inlet of the deposition chamber for receipt of ions therethrough. As described above, in use, the longitudinal direction is aligned with and/or parallel to the path of ions into the deposition chamber via the inlet 141. The block 231 may be formed of a thermally and electrically conductive material, such as copper. The block 231 may be formed in first and second parts 231a, 231b that are secured together, for example by screws, forming a slot 231c therebetween for receipt of a mount therein. The holder may comprise a lid 232 that is optionally formed of the same material as the block, such as copper. The lid 232 may be secured to the block by complementary engagement means 233 so that the lid can move between an open configuration in which the mount can be accessed and a closed configuration in which the mount is covered by the lid. The lid and the block may be slidably coupled such that the lid 232 can slide to move the lid 232 between the open and closed configuration. For example, the block may comprise a receiving portion 233a such as groove or channel and the lid may comprise a protruding portion 233b, such as a pin or screw that is configured to be received within the receiving portion 233a. The length of the receiving portion 233a may be greater than the diameter of the protruding portion 233b such that the protruding portion can slide within the length of the receiving portion thereby enabling sliding of the lid 233 relative to the block 231.

The holder 230 may comprise a mount 234 received within the slot 231c formed in the block 231. The mount has at least one opening 234a configured to receive the respective carrier substrate 160 therein. In the exemplary arrangement shown in FIGS. 2 to 4, the mount has two mount openings 234a that each receive a carrier substrate 160 therein. Each mount opening 234a is arranged so that the front surface of the carrier substrate therein is perpendicular to the longitudinal direction. In other words, the front surface of the carrier substrates faces/opposes the inlet 141 of the deposition chamber 140 through which the gas phase ions enter the deposition chamber 140. Accordingly, the front surface of the carrier substrate 160 is proximal to the front surface of the block 231. The mount openings 234a are preferably formed as through-holes. The mount 234 may be formed of a thermally conductive material or may be formed of a thickness that enables heat transfer between the mount 234 and the carrier substrate 160 retained therein. The mount 234 may be formed of stainless steel.

Each carrier substrate 160 may be received by an insert 234b extending around the periphery of the respective mount opening 234a, preferably formed of a thermally and electrically conductive material, such as copper. The insert(s) 234b are preferably cylindrical or tubular.

The front face of the block comprises one or more block opening(s) 231d correspond to and aligned with the opening(s) of the mount such that the front surface of each carrier substrate 160 is accessible via the respective opening in the block. The block openings 231d preferably do not extend through the entire thickness of the block but instead are preferably through-holes formed in the first part of the block 231a.

When the lid 232 is in the closed configuration, the holder 230 surrounds the carrier substrate 160 therein such that the carrier substrate 160 is only accessible via the respective block openings 231d and mount openings 234a. In use, the block openings 231d and mount openings 234a therefore provide the path for the ion beam to reach the carrier substrate 160.

The block 231, lid 232 and mount 234 of the holder 230 may be formed of a thermally and electrically conductive material, such as copper and/or stainless steel. The holder 230 and carrier substrate 160 received by the holder 230 may therefore be electrically coupled together.

As best shown in FIGS. 4(a) and 4(b), the shielding mechanism 210 comprises a shield 220 arranged around at least a portion of the periphery of the holder. The shield 220 is formed of a thermally insulative material such as a thermoplastic, for example PEEK. The shield 220 reduces contamination of the carrier substrate 160 by water vapour. The shield 220 reduces heating of the carrier substrate 160 within the holder by thermal radiation during, for example, transfer of the module 200 to a cryo-electron microscope. The holder 230 is moveable relative to the shield 220 so that at least a portion of the front surface of the holder 230 can be covered by the shield 220. In this specific implementation, the holder 230 moves relative to the shield 220 between a shielded configuration where the shield 220 is arranged to cover the openings within the holder 230 (i.e. the block and mount openings 234a, 234a) and so covers the front surface of the carrier substrate 160 and an exposed configuration where the shield 220 does not cover the openings within the holder 230 and so does not cover the front surface of the carrier substrate 160. However, it is also contemplated that the shield 220 could instead move relative to the holder 230 between the shielded and exposed configurations. In the exemplary embodiment shown in FIGS. 4(a) and (b), the shield 220 extends around the entire periphery of the holder 230 (i.e. around the front back and lateral surfaces). However, the shield 220 may only extend around the front surface of the holder 230 in other contemplated arrangements.

As best shown in FIGS. 4, 5 and 6, the shielding mechanism is moveable from the shielded configuration to the exposed configuration by relative movement between the shield and the holder. In the exemplary arrangement shown in FIGS. 4, 5 and 6, the holder slides in the transverse direction relative to the shield to move from the exposed to the shielded configuration. The transverse direction is transverse, particularly perpendicular to the longitudinal direction. Therefore, in use, the movement of the holder relative to the shield is transverse to the direction of the ion beam through the deposition chamber.

As best shown in FIGS. 5 and 6, the holder is biased into the shielding configuration by a biasing element 240. The biasing element may be arranged or coupled between an inner surface of the shield 220 and an outer surface of the holder 230. The biasing element in the specific arrangement shown in FIG. 2 is a spring. The biasing element 240 may be received within a recess 241 formed in the holder. The recess may be formed in a first lateral surface 230c of the block 231 of the holder 230. The biasing force and action of the biasing element is therefore transverse to the longitudinal direction.

A push element 260, which may be a pin, may be used to push the holder in the transverse against the biasing force of the spring. The push element 260 pushes the holder 230 into the exposed configuration. The push element 260 engages with a contact surface 261 of the holder 230. The contact surface 261 of the holder 230 is preferably formed in a second lateral surface 230d of the block 231 of the holder 230, which opposes the first lateral surface 230c. The contact surface 261 may be formed as a recess. The push element 260 therefore acts in an opposite direction to the biasing force of the biasing element 240.

The push element 260 may be extend from the support body of the support 145. In an arrangement where the shield 220 extends around the entire periphery of the holder 230, the push element 260 may extend through an aperture in the shield 220.

In a preferred embodiment, the push element 260 may be electrically conductive. The push element 260 may be formed of copper. The apparatus further comprises a voltage supply (not shown) and the push element may be electrically connected to a voltage supply so that contact of the push element 260 with the contact surface 261 of the holder 230 both moves the shielding mechanism from the shielded configuration to the exposed configuration and electrically couples the carrier substrate 160 within the holder to the voltage supply. The push element 260 may be configured so that when the shielding mechanism is in the shielded configuration, the push element 260 does not contact the holder 230. Consequently, electrical contact between the holder 230 and the voltage supply may only be provided when the shielding mechanism 210 in the exposed configuration (i.e. when the carrier substrate 160 is exposed). The push element 260 may be an electrical contact element. Alternatively, a separate electrical contact element may be provided that contacts the holder 230 when the shielding mechanism 210 is in the exposed configuration to electrically couple the holder 230 to a voltage supply.

The apparatus may comprise a controller (not shown) configured to control the potential applied to the carrier substrate 160 within the holder to control the energy of the ions (specifically the kinetic energy of the ions) when received at the carrier substrate 160. The controller may also control the ion optic device(s) to control the position and distribution of the ions on each carrier substrate 160 as discussed in further detail below. The controller may comprise a computer that may be operated according to a computer program comprising instructions to cause the apparatus 1 to execute the steps of the method according to the present invention.

The module 200 may comprise a base 250 on which the holder 230 and shield 220 are received. The base may comprise one or more grooves for slidably receiving the holder 230 and/or the shield 220 so that the holder 230 and shield 220 can move relative to each other. The base 250 may be formed of a thermally and electrically conductive material, such as copper.

The apparatus may further comprise a detector 180 configured to detect one or more of the ion-beam intensity, total beam energy, beam energy distribution and positions on the carrier substrate 160 where the ions are received. The detector may comprise PicoAmmeters configured to measure the total deposited charge. The total deposited charge and mean charge state of the ions may be used, for example, to estimate the number of deposited proteins and consequently achieve consistent coverage. The apparatus optionally comprises a temperature sensor 161 configured to measure the temperature of the carrier substrate 160. FIG. 7 shows the detector 180 as being received within a cavity of the support body of the support 145, the cavity referred to herein as the detector cavity. The temperature sensor 161 may also be provided within a cavity of the support body of the support 145 as shown in FIG. 7, the cavity referred to herein as the sensor cavity. However, the detector 180 and/or the temperature sensor 161 may instead be provided within the module 200, for example, within the base 250 of the module 200.

The module can comprise one or more attachment features for selective attachment to a transfer rod 170 (i.e. so that the module can be attached and detached from the transfer rod 170 during normal use). For example, the transfer rod 170 may be threaded and the module may comprise a threaded hole for receiving the transfer rod 170. As best shown in FIGS. 4(*a*) and 4(*b*), the base 250 of the module 200 may comprise the attachment features for attachment to the transfer rod 170. The transfer rod 170 may be an elongate bar having a first end and a second end. The first end of the transfer rod 170 may be attached to the module 200. The transfer rod may be formed of a thermally conductive material, such as a metal, such as copper. The transfer rod 170 optionally comprises a handle 171 at its second end. The transfer rod 170 may be cylindrical.

The deposition chamber 140 may comprise a transfer port 144 configured to receive the transfer rod 170 therethrough. The transfer port 144 is an aperture formed in a wall of the deposition chamber sized to enable passage of the transfer rod 170 therethrough. The transfer port 144 may comprise a seal configured to seal around the transfer rod 170 thereby maintaining the vacuum of the deposition chamber despite translation of the transfer rod 170 therethrough. The transfer port is optionally located on a side of the deposition chamber that extends parallel to the longitudinal direction so that movement of the transfer rod 170 therethrough is perpendicular to the longitudinal direction. In the exemplary embodiment shown, the transfer port 144 is located on an opposite side of the deposition chamber from the module-receiving portion 142 (i.e. on an upper side of the deposition chamber 140 in the view shown in FIG. 1). The second end of the transfer rod 170 may be proximal to the transfer port 144. The module 200 may be attached and detached from the transfer rod 170 while the first end of the transfer rod 170 is within the port.

As shown in FIG. 8, a cryogenic cooling system 600 configured to cryogenically cool the carrier substrate 160 is provided. The deposition chamber 140 may comprise the cryogenic cooling system as shown in FIG. 8. In the exemplary arrangement shown in FIG. 8, the cryogenic cooling system 600 comprises a cooled block 601 provided within the deposition chamber 140. The cooled block 601 may be positioned within a cavity of the deposition chamber 140, referred to herein as the cooled block cavity. In this exemplary arrangement, the cooled block 601 is spaced apart from the support 145. The cooled block 601 may be cooled by a coolant, such as gaseous or liquid nitrogen. The cooled block 601 may be in thermal contact with coolant channels 602 for receiving the coolant. Specifically, the cooled block 601 may be positioned on a flange comprising the coolant channels. A pump may be provided to circulate the coolant within the coolant channels. The cooled block 601 may be formed of a thermally conductive material, such as copper. The cooled block may be thermally coupled to the carrier substrate 160 by a thermal coupling element 603. For example, the cooled block may be thermally coupled to the carrier substrate 160 when the module is within the support 145 via the thermal coupling element 603 extending between the cooled block 601 the support 145. The thermal coupling element 603 may be flexible. The thermal coupling element 603 may comprise one or more thermally conductive wires. The plurality of thermally conductive wires may be assembled together, for example braided together, to form a flexible strap or braid. The thermal coupling element 603 may be formed as a copper braid. Advantageously, this means that the cooling system does not need to be integrated directly into the module 200 or the support 145 thereby making the alignment of the module 200 within the support 145 independent of the cryogenic cooling system 600. As shown in FIG. 7, the apparatus may further comprise a heating element 162, which may be arranged within a cavity of the body of the support 145, referred to herein as heating element cavity (FIG. 7 shows specifically the connectors of the heating element protruding from the heating element within the heating element cavity of the support 145). The heating element 162 may be configured to heat the support 145 and consequently heat the module 200 and carrier substrate 160 therein. The heating element 162 together with the thermal coupling element 603, which is coupling coupled to the cooled block 601, may be employed to change the temperature of the support body 145 and consequently the module 200 and the carrier substrate 160 retained therein. By employing both the heating element 162 and cooled block 601, the temperature of the body of the support 145 and so module 200 and carrier substrate therein 160 may be adjusted quickly. For example, the cooled block 601 may be used to cool the body of the support 145 and so module 200 and carrier substrate 160 to a first temperature, below a desired temperature. The temperature of the body of the support 145 and so module 200 and carrier substrate 160 therein may then be quickly and accurately increased to the desired temperature by using the heating element 162.

The controller may be configured to control the heating element 162, which may be a resistive heating element, to control and stabilise the temperature of the body of the support 145 and so module 200 and carrier substrate 160 therein. The controller may also regulate the flow of coolant through the coolant channels 602. The controller may be the same controller as that used to control operation of the apparatus 1 as discussed above. Alternatively, a separate controller may be employed. The controller may be a PID controller.

Figure 9:
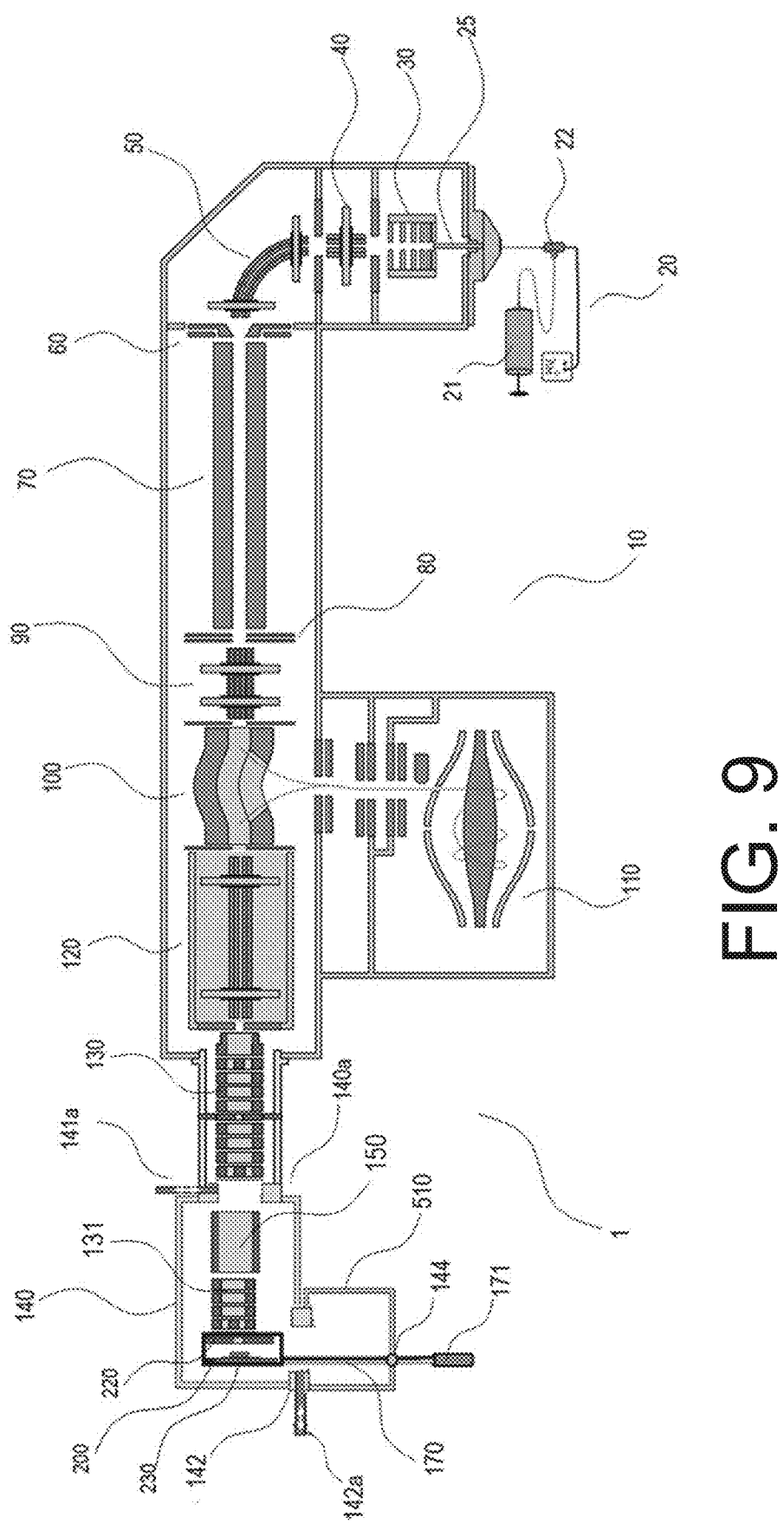
FIG. 9 is a schematic diagram of an apparatus in accordance with an exemplary embodiment of the present invention.

As best shown in FIG. 9, the apparatus 1 may additionally comprise a transfer arrangement may be provided for transferring the cryogenically-cooled carrier substrate 160 into and out of the deposition chamber and optionally to a cryo-electron microscope.

The transfer arrangement may comprise an intermediate chamber 510 configured to receive the module 200 and a pump (not shown) configured to pump the intermediate chamber 510 such that the intermediate chamber is under vacuum. The intermediate chamber 510 may be selectively coupled to the deposition chamber 140 so that the module can be moved between the intermediate chamber 510 and the deposition chamber 140 while under vacuum (i.e while maintaining the vacuum conditions within the intermediate and deposition chambers 510, 140). The intermediate chamber 510 may be coupled to the deposition chamber 140 via the module receiving portion 142. When the module receiving portion is in the open configuration, the module 200 may be moved between the deposition chamber 140 and the intermediate chamber 510. When the module receiving portion 142 is in the closed configuration, the module receiving portion 142 may seal both the deposition chamber 140 and the intermediate chamber 510. In the embodiment shown in FIG. 9, the intermediate chamber 510 comprises the transfer port 144 rather than the deposition chamber 140. As shown in FIG. 9, the transfer port 144 may be formed in a wall of the intermediate chamber 510 that opposes the module receiving portion 144 and is aligned with, optionally parallel to, to the longitudinal direction (i.e. the direction of ions through the deposition chamber 140 in use). The transfer rod 170 may be inserted through the transfer port 144 and attached to the module 200 via the attachment features once the module 200 is within the deposition chamber 140 and/or intermediate chamber 510. The intermediate chamber 510 is typically fixed in position relative to the deposition chamber 140. The intermediate chamber 510 may be a load-lock chamber.

Figure 10:
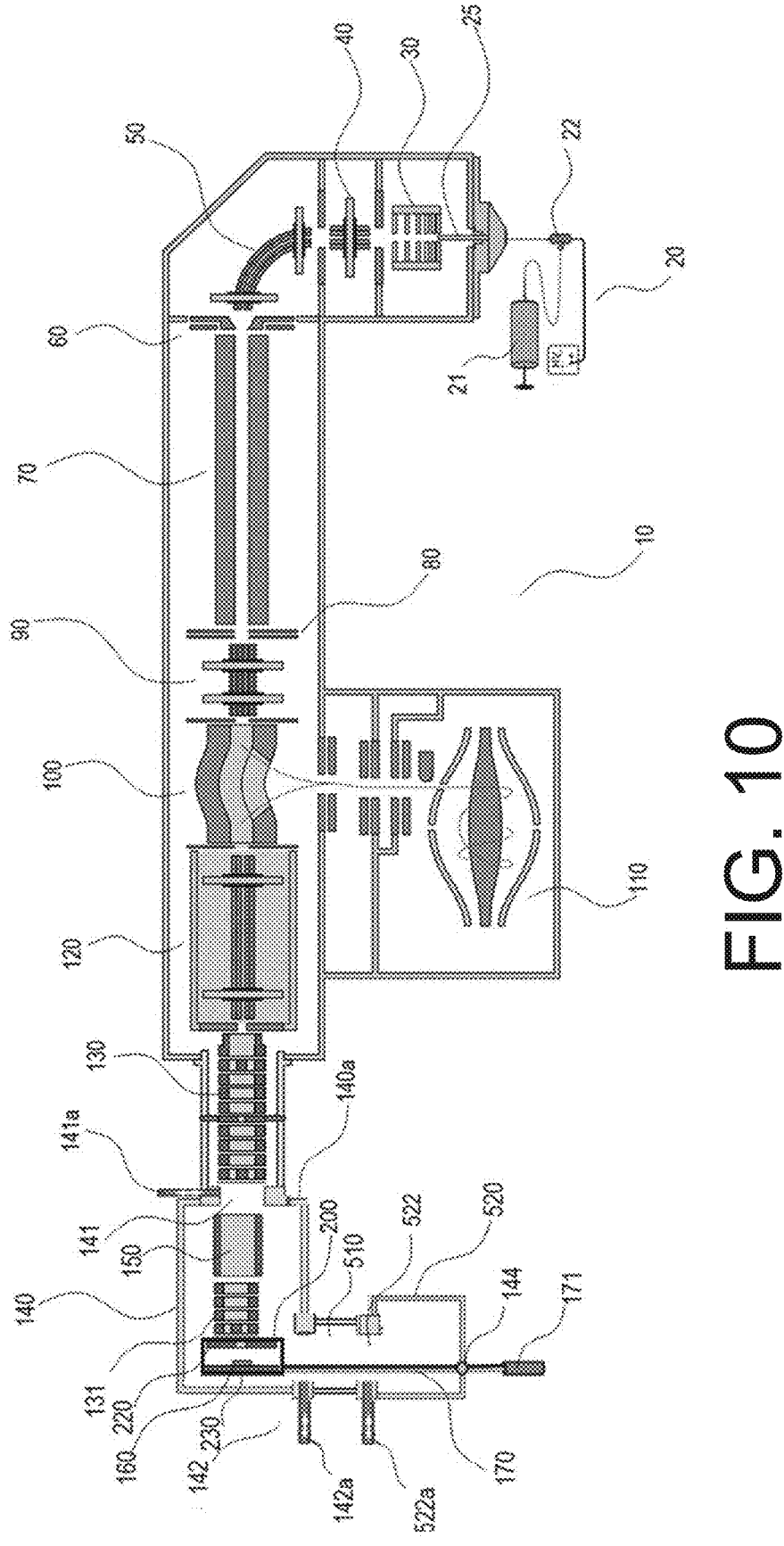
FIG. 10 is a schematic diagram of an apparatus in accordance with an exemplary embodiment of the present invention.

As shown in the apparatus of FIG. 10, the transfer arrangement may further comprise a movable chamber 520 and a pump (not shown) configured to pump the movable chamber 520 so that the movable chamber 520 is under vacuum. The movable chamber 520 may comprise a module-receiving portion 522. The module-receiving portion 522 is movable between an open configuration and a closed configuration. In this exemplary embodiment, the module-receiving portion 522 has a module-receiving aperture with a sealing surface around its periphery and a gate 522a configured to open and close to move the module receiving portion between the open configuration in which the module-receiving aperture is exposed and the closed configuration in which the module-receiving aperture is covered by the gate and the movable chamber 522 is sealed. The module-receiving portion 522 may be formed as a gate valve.

The movable chamber 520 is not fixed in position and may be moved between a position where it can be coupled to the intermediate chamber 510 and a position where it can be coupled to a cryo-electron microscope (not shown).

In such an arrangement, the movable chamber 520 may comprise the transfer port 144 configured to receiving the transfer rod therethrough. The transfer port 144 may be formed in a wall of the movable chamber 520, preferably opposing the module receiving portion 522.

In such an arrangement, the intermediate chamber 510 is coupled to the deposition chamber 140 by the module receiving portion 142a of the deposition chamber 140 and is coupled to the movable chamber 520 by the module receiving portion 522a of the movable chamber 520. In other words, the intermediate chamber 510 is coupled between the deposition chamber 140 and the movable chamber 520.

The module-receiving portion 522 of the movable chamber 520 may be aligned with the module-receiving portion 142 of the deposition chamber 140 so that the movable chamber 520, the intermediate chamber 510 and the deposition chamber 140 may be selectively coupled together via these module-receiving portions 522, 142. The module 200 can be moved between the intermediate chamber 510 and the deposition chamber 140 via the module-receiving portion 142 of the deposition chamber 140 when in the open configuration without compromising the vacuum of the intermediate chamber 510 and the deposition chamber 140. The module 200 can be moved between the movable chamber 520 and the intermediate chamber 510 via the module-receiving portion 522 of the movable chamber 520 when in the open configuration without compromising the vacuum of the intermediate chamber 510 and the movable chamber 520. The module 200 may be moved between the movable chamber 520 and the intermediate chamber 510 in a direction transverse, preferably perpendicular, to the longitudinal direction. The longitudinal direction is the direction aligned with, optionally parallel to, the movement of ions through the deposition chamber 140.

The movable chamber 520 may be moved into a first position, which is shown in FIG. 8, where the module-receiving portion 522 of the movable chamber 520 is aligned with the module-receiving portion 142 of the deposition chamber 140. When aligned, the movable chamber 520 may be selectively coupled to the deposition chamber 140 via the intermediate chamber 510

In particular, the deposition chamber 140, intermediate chamber 510 and movable chamber 520 may be coupled together via the module-receiving portions 142, 522 so that the module 200 may be moved from the deposition chamber 140 through the intermediate chamber 510 and into the movable chamber 520.

The module can be moved through the deposition chamber 140, intermediate chamber 510 and movable chamber 520 under vacuum via the transfer rod 170. The transfer rod 170 may be translated through the module-receiving portions 142, 522 of the chambers 140, 510, 520 to thereby move the module 200 therethrough. For example, the transfer rod 170 may be pushed or pulled through the chambers 140, 510, 520. The length of the transfer rod 170 may be greater than the sum of the length of the chambers in the transverse direction and the spacing therebetween.

The deposition chamber 140, intermediate chamber 510 and movable chamber 520 may be coupled together via one or more conduit(s) (not shown) through which the transfer rod and module attached thereto are translated. The conduit(s) may be, for example, tubing or pipes. The deposition chamber 140, intermediate chamber 510 and movable chamber 520 may be sealed together by the one or more conduit(s). The conduits may be formed of the same material as the walls of the deposition chamber 140, intermediate chamber 510 and/or movable chamber 520, which may be, for example, stainless steel. The conduits may be pumped by a pump of the apparatus to maintain the vacuum conditions and temperature of the cryogenically-cooled carrier substrate 160. The conduits may extend along the transverse direction (i.e. the direction transverse to the direction of ions into and through the deposition chamber 140 in use).

The deposition chamber 140, intermediate chamber 510, movable chamber 520 and guiding chamber 10 may be contained within a unitary housing through which the transfer rod 170 and the module 200 attached thereto may be translated. The unitary housing may comprise passages within which the deposition chamber 140, intermediate chamber 510 and movable chamber 520 are arranged. The module may move between the deposition chamber 140, intermediate chamber 510 and movable chamber 520 via the passages. The unitary housing may be formed of, for example, stainless steel, and may be pumped to maintain the vacuum conditions and temperature of the cryogenically-cooled carrier substrate 160. The deposition chamber 140, intermediate chamber 510 and movable chamber 520 may be spaced apart from each other along in the transverse direction (i.e. the direction transverse to the direction of the ion beam into and through the deposition chamber 140 in use). The module-receiving portions 142, 522 of the deposition chamber 140, intermediate chamber 510 and movable chamber 520 when in the first position may be aligned along the transverse direction. Accordingly, in use, the module 200 can be moved through the deposition chamber 140, intermediate chamber 510 and movable chamber 520 under vacuum by translation of the transfer rod 170 (achieved by pushing or pulling of the transfer rod 170) in the transverse direction.

The apparatus 1 described above may be formed by adapting Thermo Fisher Scientific, Inc's QExactive® quadrupole-Orbitrap® mass spectrometer to include a deposition chamber 140 configured as required by the claimed invention downstream of the ion routing multipole 120. The beam collector (AGC cup) usually downstream of the ion routing multipole 120, which may be a HCD, may be removed to allow transmission of the ion-beam from the ion routing multipole 120 into the deposition chamber 140 when the trapping voltages are not applied to the multipole 120. Ions may still be stored in the ion routing multipole 120 through the application of a DC voltage to the axial ends of the ion routing multipole 120 (a trapping voltage) as discussed above. As discussed above, the electric potentials gradients throughout the instrument may be reduced to reduce the kinetic energy of the ions travelling therethrough. By way of example, optionally, the standard transfer capillary with an i.d. of 0.58 mm may be replaced with a custom capillary 25 with a larger i.d., such as an i.d. of 0.75 mm, which moderately increases transmission. The aperture of the S-exit lens 30 may be increased, for example from 1.4 to 2.5 mm, increasing transmission up to tenfold. An additional pump may be installed to account for the additional gas load. Use of the Apparatus In an exemplary aspect, the method of the present invention may be employed with the apparatus 1 described above. However, it is noted that the method of the present invention is not limited to being performed on the apparatus 1 described above.

The method of the present invention comprises providing a carrier substrate 160, cryogenically cooling the carrier substrate 160 to form a cryogenically-cooled carrier substrate 160, generating gas phase ions of the one or more molecule(s) by electrospray ionisation, decelerating the gas phase ions; and receiving the gas phase ions on the cryogenically-cooled carrier substrate 160 to form a sample for imaging with a cryo-electron microscope, wherein the step of decelerating the ions reduces the energy of each of the ions, which may be the kinetic energy of the ions, to be less than eV per charge when received at the cryogenically-cooled carrier substrate 160.

Before inserting the module 200 into the deposition chamber 140, the detector 180 may be configured to measure ion-current and consequently determine the total beam energy of the ion beam per charge. The ion beam referred to herein refers to the beam containing the gas phase ions moving through the guiding chamber 10 and the deposition chamber 140. The detector measures total energy per charge, which is typically constant in the absence of collisions with the background gas. Therefore, the total energy of the ion beam per charge at the carrier substrate 160 when the carrier substrate 160 is positioned within the deposition chamber 140 can be assumed to be the same as the total energy of the ion beam measured at the detector 180. The detector 180 may comprise a grid with variable electric potential upstream of a detector electrode as discussed above. The method may comprise measuring ion-beam transition through the grid at the detector electrode and plotting a graph of ion-beam transition against grid potential. The method may then comprise determining the derivate of this graph to obtain the total ion beam energy distribution.

The one or more carrier substrate(s) 160 may be arranged within the holder 230 of the module 200. Specifically, the lid 232 of the holder may be moved to the open configuration, each carrier substrate 160 is inserted into the respective opening in the mount 234 and the mount slid into the slot 231c within the block 231 of the holder 230. The lid 232 of the holder 230 may then be moved to the closed configuration by sliding the lid 232 relative to the block so that the lid 232 covers the top surface of the mount 234.

The shielding mechanism 210 may be biased in the shielded configuration by the biasing element 240, which may be a spring, so that the shield 220 covers the block and mount opening(s) 231d, 234a thereby covering the first surface of the carrier substrates 160. Consequently, the carrier substrate(s) 160 are entirely covered by the shield 220 and the holder 230.

In one exemplary arrangement, as shown in FIGS. 9 and 10, the transfer rod 170 may be inserted through the transfer port 144 into the intermediate chamber 510. The module 200 may then be attached to the first end of the transfer rod 170. The module 200 may be attached to the first end of the transfer rod 170 while within the intermediate chamber 510.

The intermediate chamber 510 may then be pumped to reduce the pressure of the intermediate chamber 510 so that the intermediate chamber 510 is under vacuum.

Once the intermediate chamber 510 has reached a sufficient vacuum, the module-receiving portion 142 of the deposition chamber 140 may be moved to the open configuration and the module may then be moved through the module-receiving portion 142 of the deposition chamber 140 into the deposition chamber 140. The module 200 may be moved by translation of the transfer rod 170 (in this specific implementation shown in FIGS. 9 and 10 by pushing the transfer rod 170 therethrough). The module 200 may then be received within the body of the support 145 and aligned by the alignment features 146 with the inlet 141 of the deposition chamber 140 and optionally with any ion optics within the support 145. The module 200 may be fixed within the body of the support 145 by the fixing features 147. Once fixed within the body of the support, the module 200 may be detached from the transfer rod 170 and the transfer rod 170 retracted from the deposition chamber 140. The module-receiving portion 142 of the deposition chamber 140 may then be moved to the closed configuration (i.e. the gate 142a may be closed).

In an alternative arrangement, such as that shown in FIG. 1, the transfer rod 170 may be inserted via the transfer port 144 directly into the deposition chamber 140 (i.e. not via the intermediate chamber 510) and the module 200 may be attached to the transfer rod 170 within the deposition chamber 140. In such an arrangement, the transfer port 144 may be formed in a wall of the deposition chamber 140 as shown in FIG. 1.

The pressure within the deposition chamber 140 may then be reduced by pumping the deposition chamber 140. The module 200, and so the carrier substrate 160 within the module 200, may be cooled by the cryogenic cooling system 600 within the deposition chamber 140. Specifically, the cooled block 601 within the deposition chamber 140 may be cooled by a coolant, such as gaseous or liquid nitrogen flowing through the coolant channels in thermal contact with the cooled block 601. The cooled block 601 cools the cryogenically-cooled substrate via the thermal transfer element extending between the cooled block 601 and the support 145. As discussed above, the support 145, holder 230 and carrier substrate 160 are all thermally coupled together.

The reduction in temperature of the carrier substrate 160 may be measured using the temperature sensor 161, which may be within the module 200 or within the body of the support 145. Once the carrier substrate 160 is cryogenically cooled, the push element 260 may then be pushed towards and engaged with the holder 230 to move the holder 230 relative to the shield 220 against the biasing force of the biasing element 240 in the transverse direction from the shielded configuration to the exposed configuration so that the mount and block opening(s) 234a, 231d that were previously covered by the shield 220 are exposed.

The contact between the push element 260 and the holder 230 provides electrical coupling between the voltage supply and the carrier substrate 160 within the holder 230.

The step of generating gas phase ions may comprise receiving a solution comprising one or more molecule(s) dissolved in a solvent and generated gas phase ions from the solution. The solvent may be an aqueous solvent. The gas phase ions may be charged gas-phase molecules. The molecule(s) may be at least partially ionised by the electrospray ion source. The gas phase ions generated and decelerated towards the cryogenically-cooled carrier substrate may form an ion beam.

Preferably, the molecules are proteins in one of their native states and so the gas phase ions are charged proteins in their native states. The molecules may be a protein-ligand or protein-protein complex.

Accordingly, the electrospray ionisation performed may be native electrospray ionisation. During native electrospray ionisation, the electrospray ionisation conditions are carefully controlled to retain any protein-ligand and protein-protein non-covalent interactions and the folding of the protein during formation of the gas phase ions. Accordingly, native electrospray ionisation retains proteins in a near-native, folded state in an ultra-pure gas-phase molecular beam. The electrospray ionisation source 20 and ion optic devices described above operate at much lower electric potentials and lower flow rates compared to when used for m/z analysis in order to generate and guide stable native gas phase ions. For example, potentials around 1 kV instead of 3 kV and flow rates of several nL/min instead of several μL/min. During electrospray ionisation, small solvent droplets are emitted at atmospheric pressure, evaporate, and undergo coulomb explosions during the transfer into the guiding chamber, resulting in individual charged gas-phase molecules. In native electrospray ionisation, electric potentials and pressure in the guiding chamber of the apparatus are fine-tuned to remove residual solvents or surfactants by collision-induced dissociation (CID).

The ions may optionally be filtered prior to being received on the carrier substrate 160. The ions may be filtered according to their mobility or m/z ratio. For example, the ion filter may be a quadrupole filter configured to filter the ions according to their m/z ratio. In arrangements where the gas phase ions are ionised proteins in their native state, the quadrupole mass filter may be used to select a specific state of the protein, e.g. drug bound or unbound or the Thermo Scientific™ FAIMS Pro™ interface may be used to filter the ions according to their mobility, and so their shape or conformation. Furthermore, an ion mobility drift tube may be use to filter the ions according to their mobility, and so their conformation or shape.

The ions are guided towards the carrier substrate 160 using the ion optics. The method may comprise controlling the ion optics, for example the steering lenses 130, to direct a first set of ions to a first portion of the carrier substrate 160. Once the first set of ions are received on the first portion of the carrier substrate 160, the ion optics may be controlled to direct a second set of ions onto a second portion of the carrier substrate 160. The ion optics, such as the steering lenses 130, 131 may be controlled by changing the potentials applied to the segments of the steering lenses 130, 131. For example, to steer the gas phase ions to the left, a small additional potential may be applied to the left segment as discussed above. The first and second portions of the carrier substrate 160 may not overlap. The first set of ions may be from a first molecule. The second set of ions may be generated from a second molecule. The first molecule may be a first protein and the second molecule may be a second protein. The first molecule may be a first protein and the second molecule may be a complex of the first protein and a ligand. The first molecule may be a first protein in a first native state and the second molecule may be a first protein in a second native state. The first molecule may be a complex of a first protein and a first ligand and the second molecule may be a complex of a first protein and a second ligand.

The first set of ions may be generated from a first solution and the second set of ions may be generated from a second solution.

Alternatively, the first set of ions and the second set of ions may be generated from the same solution. The settings of ion filter 70 may be adjusted so that the first set of ions are those filtered according to a first setting and the second set of ions are those filtered according to a second setting. For example, the first set of ions may be those having a first conformation and the second set of ions may be those having a second conformation. In an alternative arrangement, the ion filter may be a m/z filter and the first set of ions may have m/z values in a different range from the second set of ions. The ion filter may be used to select a specific state of protein ions and the first set of ions may have be in a different state from the second set of ions e.g. a different native state or a different binding state.

If there is a second carrier substrate 160, then deposition of the ions can be started on the second carrier substrate 160 once the first carrier substrate 160 has been sufficiently covered as detected by the PicoAmmeters of the detector 180. As discussed above, the PicoAmmeters may be configured to measure the total deposited charge. The total deposited charge and mean charge state of the ions may be used to estimate the number of deposited proteins, and achieve consistent coverage. Similarly to the arrangement where the first carrier substrate 160 has first and second portions, the first set of ions may be guided towards the first carrier substrate 160 and the ion optics may be adjusted by the controller to direct the second set of ions towards the second carrier substrate 160.

The ions are decelerated towards the carrier substrate 160 by controlling the potential applied to the carrier substrate 160 to be less than the beam energy of the ions. The potential may applied to the carrier substrate 160 when the push element 260 contacts the holder 230. The push element 260 may be electrically coupled between the voltage supply and the holder 230, which is in turn electrically coupled to the carrier substrate 160.

The method may comprise controlling the potential applied to the carrier substrate 160 by a controller based on the measured total ion beam energy, which was measured by the detector 180 before the module 200 was received within the deposition chamber 140. The voltage applied to the carrier substrate 160 may be controlled so that the carrier substrate 160 has a potential that is less than the total ion beam energy. The total ion beam energy comprises both the kinetic and potential energy of the ions and may typically be between −3 eV and −10 eV, for example between −5 eV and −8 eV per charge. The typical ion beam intensity for native proteins may range from 10 to 50 pA, or >100 pA, or preferably >1 nA, depending on protein concentration and electrospray performance. The kinetic energy of the ions when received on the cryogenically-cooled carrier substrate (i.e. the landing energy) is less than 20 eV per charge. This is achieved by setting the potential of the carrier substrate 160 to be 20V below the energy of the ions entering and/or moving through the deposition chamber (i.e. the ion beam energy) measured by the detector 180. Preferably, the kinetic energy of the ions when received on the cryogenically-cooled carrier substrate (the landing energy) is less than 10 eV per charge by setting the potential of the carrier substrate 160 to 10 V below the total ion beam energy, more preferably the landing energy is less than 5 eV per charge by setting the potential of the carrier substrate 160 to 5 V below the total ion beam energy. Most preferably, the landing energy is less than 3 eV per charge by setting the potential of the carrier substrate 160 to 3 V below the total ion beam energy.

The step of receiving the gas phase ions of the one or more molecule(s) on the cryogenically-cooled carrier substrate 160 may be performed under an atmosphere having a temperature of less than 250K, preferably less than 150 K, more preferably less than 80 K. The steps of generating and decelerating the gas phase ions may also be performed under an atmosphere having a temperature of less than 250K, preferably less than 150 K, more preferably less than 80 K.

The steps of decelerating and receiving the gas phase ions of the molecule(s) are typically performed under vacuum.

In an arrangement where the ions are filtered, the method may comprise operating the apparatus, specifically the mass spectrometer, in a first mode of operation where the ions stored in the C-trap 100 are ejected to the mass analyser 110. The ions may then be analysed by the mass analyser and mass spectra generated to verify the filtration performed by the mass filter 70. The method may then comprise switching operation of the apparatus to a second mode of operation by controlling the trapping voltages applied to the C-trap 100 and ion routing multipole 120. In the second mode of operation, the ions stored in the C-trap 100 may be ejected from the C-trap 100 to the ion routing multipole 120 (axially) and from the ion-routing multipole 120 to the deposition chamber 140 (axially) and subsequently received on the carrier substrate 160.

The method of the present invention may be varied according to the type of sample desired as set out below.
Generating Substantially Ice-Free Samples The method may comprise controlling the temperature of the atmosphere in which the step of receiving the gas phase ions on the cryogenically-cooled carrier substrate 160 (and optionally also the step of decelerating the ions) may be performed and/or the partial pressure of water of the atmosphere in which the step of receiving the gas phase ions on the cryogenically-cooled carrier substrate 160 (and optionally also the step of decelerating the ions) may be performed such that the rate of ice growth on the cryogenically-cooled carrier substrate 160 is less than one monolayer per hour, optionally such that no ice growth occurs on the cryogenically-cooled carrier substrate 160. The method may comprise controlling the temperature within the deposition chamber 140 (and optionally also within the guiding chamber 10) and/or the partial pressure of water within the deposition chamber 140 (and optionally also within the guiding chamber 10) such that the rate of ice growth on the cryogenically-cooled substrate 160 is less than one monolayer per hour, optionally such that no ice growth occurs on the cryogenically-cooled carrier substrate 160.

The method may comprise controlling the temperature of the atmosphere in which the step of receiving the ions on the cryogenically-cooled carrier substrate 160 on the cryogenically-cooled carrier substrate is performed and/or the partial pressure of water of the atmosphere in which the step of receiving the ions on the cryogenically-cooled carrier substrate 160 on the cryogenically-cooled carrier substrate is performed such that the rate of sublimation is greater than the rate of condensation of water.

The temperature of the atmosphere of the cryogenically-cooled carrier substrate may be less than 250K, preferably less than 175 K at which the carrier substrate remains cryogenically cooled and thermal motion of the gas phase ions is reduced.

The step of receiving the gas phase ions on the cryogenically cooled substrate 160 (and optionally also the step of decelerating the gas phase ions) for this arrangement may performed in an atmosphere having a partial pressure of water of less than $1 \times 10^{-8}$ mbar and a temperature of greater than 80 K, more preferably greater than 100 K, most preferably greater than 110 K. Preferably, the step of receiving the ions on the cryogenically-cooled carrier substrate may be performed under an atmosphere having a partial pressure of water of less than $1 \times 10^{-10}$ mbar and a temperature of greater than 130 K. In other words, the deposition chamber 140, and preferably also the guiding chamber 10, may have a partial pressure of water of less than $1 \times 10^{-8}$ mbar and a temperature of greater than 80 K, more preferably greater than 100 K, most preferably greater than 110 K. Preferably, the deposition chamber 140, and preferably also the guiding chamber 10, may have a partial pressure of water of less than $1 \times 10^{-10}$ mbar and a temperature of greater than 130 K. These low partial pressures of water may be achieved by pumping the deposition chamber (and optionally the guiding chamber) using a pump. Employing an atmosphere having such partial pressures of water and temperatures reduces formation of ice on the cryogenically-cooled carrier substrate 160.

Optionally, the gas phase ions received at the carrier substrate may be free of water vapour. For example, if the gas phase ions are generated with a solvation shell, then the solvation shell may be evaporated during deceleration of the ions towards to the cryogenically-cooled carrier substrate and/or during the step of receiving the ions on the cryogenically-cooled carrier substrate due to the reduced partial pressure of the solvent and/or increased temperature in the atmosphere in which the step of deceleration of the ions and/or the step of receiving the ions on the cryogenically-cooled carrier substrate are performed. Consequently, the gas phase ions may be received on the carrier substrate without frozen solvent or matrix being formed. For example, if gas phase ions are generated with a solvation shell containing water molecules, then the partial pressure of water within the atmosphere surrounding the cryogenically-cooled carrier substrate may be reduced and/or the temperature of the atmosphere surrounding the cryogenically-cooled carrier substrate may be increased so that the solvation shell is evaporated during deceleration of the ions towards the carrier substrate and/or during receiving the ions on the cryogenically-cooled carrier substrate and consequently no ice may be formed on receiving the gas phase ions on the carrier substrate.

As discussed above, avoiding ice growth by controlling the partial pressure of water and/or the temperature of the atmosphere in which the step of receiving the gas phase ions on the cryogenically-cooled carrier substrate 160 is performed may eliminate ice and solvent related issues including the air-solvent interface strong and inhomogeneous background signal, unintentional devitrification, beam-induced motion of the ice, and inhomogeneous particle distribution. As discussed in respect of the data presented in this annex to this application, when substantially ice-free samples of native proteins are prepared and imaged, the proteins remain folded and the subunits remain attached to each other, despite dehydration, collision with the substrate, and prolonged exposure to the substrate-vacuum interface at room temperature.

Samples With Retained Solvation Shell

In an alternative aspect, the gas phase ions may have a solvation shell that is retained when the gas phase ions are received on the cryogenically-cooled carrier substrate 160.

As discussed above, the gas phase ions may be generated from a solution comprising one or more molecules dissolved in a solvent. The solvent may be an aqueous solvent.

The gas phase ions generated may be one or more charged gas-phase molecules comprising a solvation shell. The gas-phase molecules may be ionised proteins.

The solvation shell may be referred to as a hydration shell and describes the arrangement where solvent molecules are arrangement around the gas phase ion. The solvent may be water and so each gas phase ion may be surrounded by water molecules. In other words, the gas phase ions may be hydrated.

The method may comprise controlling the temperature of the atmosphere in which the steps of receiving the gas phase ions on the cryogenically-cooled carrier substrate 160 and decelerating the ions may be performed and/or the partial pressure of solvent of the atmosphere in which the steps of receiving the gas phase ions on the cryogenically-cooled carrier substrate 160 and decelerating the ions may be performed so that the solvation shell is retained when each charged gas-phase molecule is received on the cryogenically-cooled carrier substrate 160. The method may comprise controlling the temperature within the deposition chamber 140 and within the guiding chamber 10 and/or the partial pressure of solvent within the deposition chamber 140 and within the guiding chamber 10 so that the solvation shell is retained when each charged gas-phase molecule is received on the cryogenically-cooled carrier substrate 160.

For example, where the solvent is water, the steps of decelerating the gas phase ions and receiving the ions on the cryogenically-cooled carrier substrate 160 may be performed under an atmosphere having a partial pressure of water of greater than $1\times10^{-10}$ mbar and a temperature of less than 130K, preferably less than 100K. Preferably, the steps of decelerating the gas phase ions and receiving the ions on the cryogenically-cooled carrier substrate may be performed under an atmosphere having a partial pressure of water between $1\times10^{-10}$ mbar and $1\times10^{-7}$ mbar and a temperature of less than 100K. In other words, the deposition chamber 140 and the guiding chamber 10 may have a partial pressure of water of greater than $1\times10^{-10}$ mbar and a temperature of less than 130K, preferably less than 100K. Preferably, the deposition chamber 140 and the guiding chamber 10 have a partial pressure of water between $1\times10^{-10}$ mbar and $1\times10^{-7}$ mbar and a temperature of less than 100K.

The potentials applied to the ion optics are configured such that potential gradients along the trajectory of the beam are reduced to minimize collisional activation and heating, which in turn reduces desolvation.

The temperature of the atmosphere in which the steps of decelerating the gas phase ions and receiving the ions on the cryogenically-cooled carrier substrate 160 may be performed may be less than 250K, preferably less than 175 K at which the carrier substrate remains cryogenically cooled and thermal motion of the gas phase ions is suppressed.

The solvation shell condenses or freezes on impact with the cryogenically-cooled carrier substrate 160 thereby providing a sample where the gas phase ions are surrounded by the frozen solvent. Accordingly, the frozen solvent does not form a continuous layer but is non-continuous. This is advantageous as the frozen solvent may protect the sample during imaging, but as the frozen solvent is only present around the particles, does not significantly reduce the signal to noise ratio.

Samples With Injected Protective Matrix

In an aspect of the invention, the sample may comprise gas phase ions received on the substrate surrounded by a matrix.

To form such samples, the method may comprise injecting a matrix-forming fluid either before or after the step of receiving the gas phase ions on the cryogenically-cooled substrate.

In an arrangement where the matrix-forming fluid is injected before the step of receiving gas phase ions on the carrier substrate 160, the matrix-forming fluid may be received at the cryogenically-cooled carrier substrate 160 during the step of receiving the gas phase ions on the cryogenically-cooled carrier substrate 160 and forms a matrix around the ions. The matrix-forming fluid may be injected by the injector which may be positioned to inject the matrix-forming fluid into the guiding chamber 10 or into the deposition chamber 140.

Injecting the matrix-forming fluid before the step of receiving the gas phase ions on the cryogenically-cooled substrate 160 and receiving this at the cryogenically-cooled carrier substrate 160 before or during the step of receiving the gas phase ions on the cryogenically-cooled carrier substrate is particularly advantageous. This is because, the matrix protects the gas phase ions while the gas phase ions are received at the cryogenically-cooled substrate 160 but is unlikely to embed the sample formed which would otherwise decrease the signal-to-noise ratio when imaged by a cryo-electron microscope.

Alternatively, the matrix-forming fluid may be injected after the step of receiving the gas phase ions on the cryogenically-cooled substrate. The matrix-forming fluid may be injected by the injector, which is positioned to inject the matrix-forming fluid into the deposition chamber 140.

In an arrangement where the matrix-forming fluid is injected after the step of receiving gas phase ions on the carrier substrate 160, the matrix-forming fluid may be received at the cryogenically-cooled carrier substrate 160 after the step of receiving the gas phase ions on the cryogenically-cooled carrier substrate 160 and forms a matrix around the ions.

In either arrangement, the matrix forms on and around the ions. The matrix may mitigate damage on landing of the gas phase ions on the cryogenically cooled substrate by providing additional degrees of freedom to dissipate the landing energy. The matrix may also mitigate damage otherwise caused by the electron beam during imaging the ions.

The matrix-forming fluid is capable of freezing or solidifying or crystallising under the cryogenic conditions of the cryogenically-cooled carrier substrate to therefore form the matrix. The matrix-forming fluid may comprise a liquid and/or a gas. The matrix-forming fluid may comprise or be a vaporised solvent. The matrix-forming fluid may condense, freeze, crystallise or solidify on impact with the cryogenically-cooled carrier substrate. The term matrix refers to a species or component that is does not comprise the sample ions.

The matrix-forming fluid may comprise a liquid and/or a gas. The matrix-forming fluid may comprise or be a vaporised solvent. The matrix-forming fluid may condense, freeze or crystallise or solidify on the cryogenically-cooled carrier substrate 160. The term matrix refers to a species or component that is does not comprise the sample ions.

The matrix may be a protective species that is formed around, and/or on, the gas phase ions received on the cryogenically-cooled carrier substrate.

The matrix may optionally sublime after the gas phase ions are received on the cryogenically-cooled substrate. Consequently, the matrix may protect and immobilises the ions on landing on the carrier substrate and optionally also during transportation of the sample without interfering with imaging of the sample.

The method may comprise controlling flow rate of injection of the matrix-forming fluid and/or the partial pressure of the matrix-forming fluid of the atmosphere surrounding the cryogenically-cooled carrier substrate and/or the temperature of the atmosphere surrounding the cryogenically-cooled carrier substrate to control the thickness of the matrix formed. Optionally, the flow rate of injection of the matrix-forming fluid and/or partial pressure of the atmosphere surrounding the cryogenically-cooled carrier substrate and/or the temperature of the atmosphere surrounding the cryogenically-cooled carrier substrate may be controlled such that the thickness of the matrix is similar, optionally the same as, the thickness of the sample formed. This is advantageous as any additional thickness would decrease the signal-to-noise ratio when imaged with a cryo-electron microscope. Optionally, the flow rate of injection of the matrix-forming fluid and/or the partial pressure of the matrix-forming fluid of the atmosphere surrounding the cryogenically-cooled carrier substrate and/or the temperature of the atmosphere surrounding the cryogenically-cooled carrier substrate may be controlled such that matrix forms a continuous layer, preferably of uniform thickness.

The matrix may therefore be formed as a layer of controlled thickness. This is in contrast to known arrangements where a layer of ice of potentially irregular thickness in which the ions are embedded is formed thereby reducing resolution of the subsequent imaging performed.

The matrix may be a protective species that is formed around, and/or on the gas phase ions deposited on the cryogenically-cooled carrier substrate 160.

The matrix-forming fluid may be water vapour and the matrix formed on the carrier substrate 160 may be ice.

Alternatively, the matrix-forming fluid may comprises an inert gas, preferably wherein the inert gas comprises one or more of Ar, Kr, Ne, $H_2$. The inert gas may condense or freeze on the carrier substrate 160 forming the matrix around the particles.

The matrix may comprise self-assembled monolayers and the matrix-forming fluid may comprise a thin film or a solution of self-assembled monolayers.

The method may comprise controlling the partial pressure of the matrix-forming fluid of the atmosphere surrounding the cryogenically-cooled substrate and/or the temperature of the atmosphere surrounding the cryogenically-cooled substrate to control the thickness of the matrix formed. In other words the method may comprise the partial pressure of the matrix-forming fluid within the deposition chamber and the temperature of the deposition chamber may be controlled to control the thickness of the matrix formed.

The flow rate at which the matrix-forming fluid is injected may be controlled to thereby control the thickness and phase of the matrix around the particles.

It is possible to employ a method where the partial pressure of solvent within the deposition chamber and guiding chamber are controlled so that the gas phase ions retain a solvation shell during guiding and deceleration towards the carrier substrate 160 and while they are received on the carrier substrate 160 and also where the method further comprises injecting a matrix-forming fluid before and/or after receiving the gas phase ions on the cryogenically-cooled carrier substrate 160.

The maintained solvation shell may protect the gas phase ions on landing on the cryogenically-cooled carrier substrate 160. For example, when the solvent of the solvation shell is water molecules, the solvation shell may freeze forming ice specifically around the gas phase ions rather than as a continuous sheet. The injection of a matrix-forming fluid may additionally be used to form a protective matrix around the gas phase ions that may provide additional degrees of freedom to distribute the landing energy of the ions (the kinetic energy of the ions when received at the cryogenically-cooled carrier substrate). The control of temperature and pressure within the deposition chamber 140 and optionally within the guiding chamber 10 and the flow rate of injection of the matrix-forming fluid may be controlled to form a matrix of controlled thickness and distribution so that the matrix does not substantially interfere with the subsequent imaging by the cryo-EM. As discussed above, the matrix may sublime after receiving the gas phase ions on the cryogenically-cooled carrier substrate 160, optionally after transportation of the sample to the cryo-electron microscope such that the matrix does not interfere with imaging of the sample. The ice or other frozen solvent formed around the molecules on freezing of the solvation shell (i.e. formed as a discontinuous layer) may protect the molecules during imaging.

Transport to Cryo-Electron Microscope

The method may optionally comprise transporting the samples to a cryo-electron microscope for imaging.

Once the ions are deposited on the carrier substrate(s) 160 to form the samples, the transfer rod 170 may be inserted into the deposition chamber 140 via the transfer port 144 and re-attached to the module 200 via the attachment features.

In one arrangement, the transfer rod 170 may be inserted directly into the deposition chamber 140 via the transfer port 144. In the arrangement shown in FIG. 9, the transfer rod 170 may be inserted into the deposition chamber 140 via the transfer port 144, the intermediate chamber 510 and the module-receiving portion 142. In the arrangement shown in FIG. 10, the transfer rod 170 may be inserted into the deposition chamber 140 via the transfer port 144, the intermediate chamber 510, the movable chamber and the module-receiving portions of the deposition and movable chambers 142, 522.

The module 200 may then be directly transported from the deposition chamber 140 to a cryo-electron microscope for imaging while maintaining the cryogenically-cooled carrier substrate to be cooled and while maintaining vacuum conditions. The module 200 may be moved from the deposition chamber 140 to the cryo-electron microscope by the transfer rod 170. On removing the module 200 from the deposition chamber 140, the push element 260 extending from the support body of the support 145 no longer contacts the contact surface 261 of the holder 230. Consequently, the push element 260 no longer pushes the holder against the biasing force of the biasing element 240 and the holder 230 and shield 220 revert to the shielded configuration. Therefore, the carrier substrate 160 is shielded by the shield 220 during transportation.

In an alternative arrangement, which may optionally use the exemplary apparatus of FIGS. 9 and 10, the module 200 may not be directly transported from the deposition chamber 140 to a cryo-electron microscope. For example, the module 200 may be transferred from the deposition chamber 140 through the intermediate vacuum chamber 510 and into the movable chamber 520 by translation of the transfer rod 170 from the deposition chamber 140 through the intermediate vacuum chamber 510 and into the movable chamber 520. The module-receiving portion 142 of the deposition chamber 140 and the module-receiving portion 522 of the movable chamber 520 may be moved to the open configuration to enable movement of the module 200 and transfer rod 170 therethrough in the transverse direction. Once the module 200 is in the movable chamber 520, the module-receiving portions 142, 522 of the deposition and movable chambers 140, 520 may be closed to re-seal these chambers.

The movable chamber 520 may be moved from the first position where it is coupled to the intermediate chamber 510 to a second position where it is configured to receive the electron beam of the cryo-electron microscope. The movable chamber 520 may be de-coupled from the intermediate chamber and its module-receiving portion 522 closed and then moved towards and coupled to a cryo-electron microscope for imaging the samples. The movable chamber 520 may comprise a conveyor or other moving devices (not shown) configured to translate the movable chamber 520. Alternatively the movable chamber 520 may be moved manually towards the cryo-electron microscope. Once the movable chamber 520 is in the second position, the transfer rod 170 may be detached from the module 200. The movable chamber 520 may receive the electron beam of the cryo-electron microscope via the module-receiving portion 522 of the movable chamber 520 when the module-receiving portion 522 is in the open configuration. Alternatively, the electron beam may pass into the movable chamber 520 via an inlet (not shown) formed in a front surface of the movable chamber that is substantially aligned with or parallel to the first surface of the carrier substrate 160.

Once the module 200 is within/coupled to the cryo-electron microscope, the samples may be exposed for imaging by the cryo-electron microscope by moving the shielding mechanism 210 to the exposed configuration in a similar way to that described above (i.e. by using a push element that moves the holder relative to the shield).

The movable chamber 520 may instead be de-coupled from the intermediate chamber 510 and moved to a loading station (not shown). The method may further comprise removing the lid of the holder to the open configuration to access the mount 234, removing the samples from the mount 234 using a gripping device, such as tweezers, and transporting the samples within a storage container to the cryo-electron microscope for imaging. The storage container may be cooled using a coolant, such as liquid nitrogen.

The foregoing detailed description has been provided by way of explanation and illustration, and is not intended to limit the scope of the appended claims. Many variations of the presently preferred embodiments illustrated herein will be apparent to one of ordinary skill in the art, and remain within the scope of the appended claims and their equivalents.

Experimental Data

The following experimental data is taken from Mass-selective and ice-free cryo-EM protein sample preparation via native electrospray ion-beam deposition; Tim K. Esser, Jan Böhning, Paul Fremdling, Mark T. Agasid, Adam Costin, Kyle Fort, Albert Konijnenberg, Alan Bahm, Alexander Makarov, Carol V. Robinson, Justin L. P. Benesch, Lindsay Baker, Tanmay A. M. Bharat, Joseph Gault, Stephan Rauschenbach bioRxiv 2021.10.18.464782; doi: https://doi.org/10.1101/2021.10.18.464782 posted on 19 Oct. 2021, which, together with its supplementary information, is hereby incorporated by reference, it is noted that the inventors of this application are authors of this preprint.

The experiments performed relate to a cryo-EM sample preparation workflow, which combines state-of-the-art native MS and electrospray ion-beam deposition (ES-IBD). The preprint describes that native electrospray ion-beam deposition (native ES-IBD) replaced solution-based enrichment and purification with continuous accumulation of mass-filtered biomolecules on cryo-EM grids in vacuum, under controlled deposition conditions. It describes that a commercial MS platform (Thermo Scientific™ Q Exactive™ UHMR) was extended and modified by integrating custom ion-beam deposition hardware and software. The preprint describes that the workflow enabled preparation of ice-free cryo-EM samples of mass-selected, adsorbed, native, gas-phase proteins and protein assemblies and that protein shapes and complex/assembly topologies obtained after imaging and 3D reconstruction were consistent with those obtained from vitrified samples.

The preprint describes that a native ES-IBD instrument based on a commercial, high resolution mass-spectrometry platform (Orbitrap Q Exactive UHMR) was implemented. The ion-source and instrument operation mode were modified and home-made deposition ion-optics and control software were used. The preprint describes that the modifications allow for extraction of an ion beam from the collision cell for controlled deposition onto various substrates, including TEM grids, at room temperature and in vacuum. The preprint describes that they demonstrate homogeneous coverage of ice-free cryo-EM grids with mass-selected specimens. Ion-beam intensities for mass-selected native proteins range from 10 to 100 pA, and typically allow cryo-EM grids to be covered within 30 minutes. The preprint describes that careful thermalization and guiding of the ion-beam allows to keep landing energies below 2 eV per charge, where covalent bonds are unlikely to be affected. The preprint then describes the significant improvements of ion-beam intensity and landing energy control, combined with freezing in liquid nitrogen after sample transfer under ambient conditions, and imaging at cryogenic temperatures, enabled demonstration of 3D reconstruction after gas-phase purification and gentle surface deposition.

Protein solutions were prepared using a standard native MS workflow, including exchange of buffer to volatile ammonium acetate.

In QExactive® quadrupole-Orbitrap® mass spectrometer, ions are typically desolvated using collision induced dissociation (CID) in atmosphere to vacuum interface or higher-energy collisional dissociation in the quadrupole collision cell to achieve highest m/z precision. Instead, for all experiments, electric potential gradients were reduced through-out the instrument to promote soft, non-activating conditions, while retaining high ion transmission.

Initially, mass spectra were acquired to ensure native conditions, evaluate nano-electrospray stability, and to select a suitable quadrupole mass filter transmission range. The instrument mode was then switched to guide the ion beam through a collision cell, where it was thermalized, before entering a custom deposition stage and reaching a custom, room-temperature sample holder at a pressure of $10^{-5}$ mbar. An integrated, retarding-grid ion-current detector recorded the ion-beam intensity, total beam energy, and beam energy distribution. The concentration of the protein solution and ion source parameters were optimized for beam intensity and stability. The total beam energy (kinetic energy and potential energy relative to ground) typically decreases by only 1.5 eV per charge between the collision cell and sample, due to collisions with the background gas, indicating non-activating transfer through the custom DC ion optics. The full-width-half-maximum (FWHM) of the beam energy distribution was typically below 1 eV per charge, allowing to use landing energies below 2 eV per charge.

As described in the preprint, prior to deposition, TEM grids with carbon films were placed into a sample holder, and inserted into a deposition chamber via a vacuum load-lock. Plasma-cleaning to produce a more hydrophilic surface was not required, as the method bypasses the application of a liquid to the grid at any point. The deposition current on the grids was monitored using a picoammeter, to align the ion beam and obtain the total deposited charge, in picoampere hours (pAh), by integrating the deposition current. Typically, 10 to 15 pAh were collected in 30 minutes. The total deposited charge and mean charge state were used to estimate the number of deposited proteins, typically about $10^{10}$, and achieve consistent coverage between experiments. Particle density measurements across the grid typically indicated a Gaussian-shaped particle density distribution with a FWHM around 1 mm, meaning that the entire grid was covered without moving the beam and the density increases towards the grid centre.

After deposition, TEM grids were retrieved via the vacuum load-lock, transferred under ambient conditions, and manually plunged into liquid nitrogen within two minutes. Fast cooling rates as used for vitrification were not required due to the absence of water. Samples were stored in liquid nitrogen for less than two days. Subsequent sample transfer, imaging, and data processing proceeds using standard SPA workflows established for samples with vitrified ice.

Figure 11:
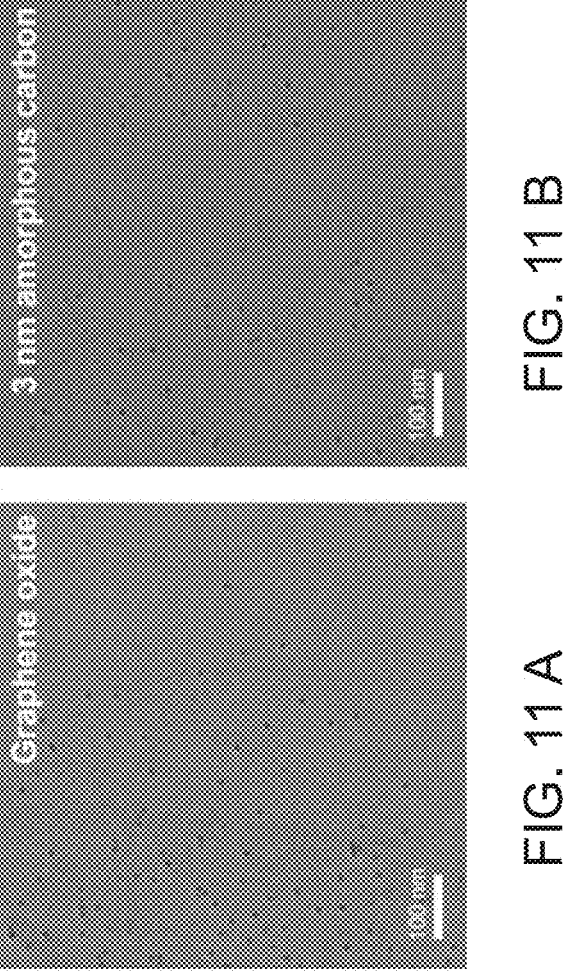

Initial experiments were conducted with deposition and imaging at room-temperature, i.e. without freezing. An apo-/holo-ferritin mixture was deposited on Quantifoil grids with home-made graphene oxide (GO) films. The high contrast of the iron core of holoferritin allowed investigation of particle density and distribution at room temperature, even though the protein was hardly visible. FIG. 11(*a*) is a room-temperature TEM micrograph of ferritin, deposited on a home-made graphene oxide film. Particles are found mainly in areas with thick GO film (left side). FIG. 11(*a*) shows the variation of particle density with GO substrate film thickness across a single micrograph. The particle density is high and homogeneous on thick GO films (left), but only few particles are found on thin films (right). This observation was rationalised by suppression of thermal particle diffusion due to stronger Van-der-Waals interaction and higher density of edges and defect sites on the thicker areas, as previously observed for the adsorption of clusters on freestanding graphene.

To avoid artefacts caused by the irregular surface and film thickness of graphene oxide films, the subsequent experiments used commercial 3 nm amorphous carbon grids which suppress thermal diffusion and provide a consistent homogeneous background in EM micrographs over the entire grid. This enabled homogeneous coverage to be obtained, as shown in FIG. 11(*b*), where FIG. 11(*b*) is a room-temperature TEM micrograph of ferritin on a 3 nm amorphous carbon film under identical deposition and imaging conditions, demonstrating a clean sample with homogeneous particle density. The majority of particles are well separated from each other rather than aggregated. The entire grid was covered with increasing particle density towards the centre, allowing to select an ample number of grid squares with ideal density for data collection.

Figure 12:
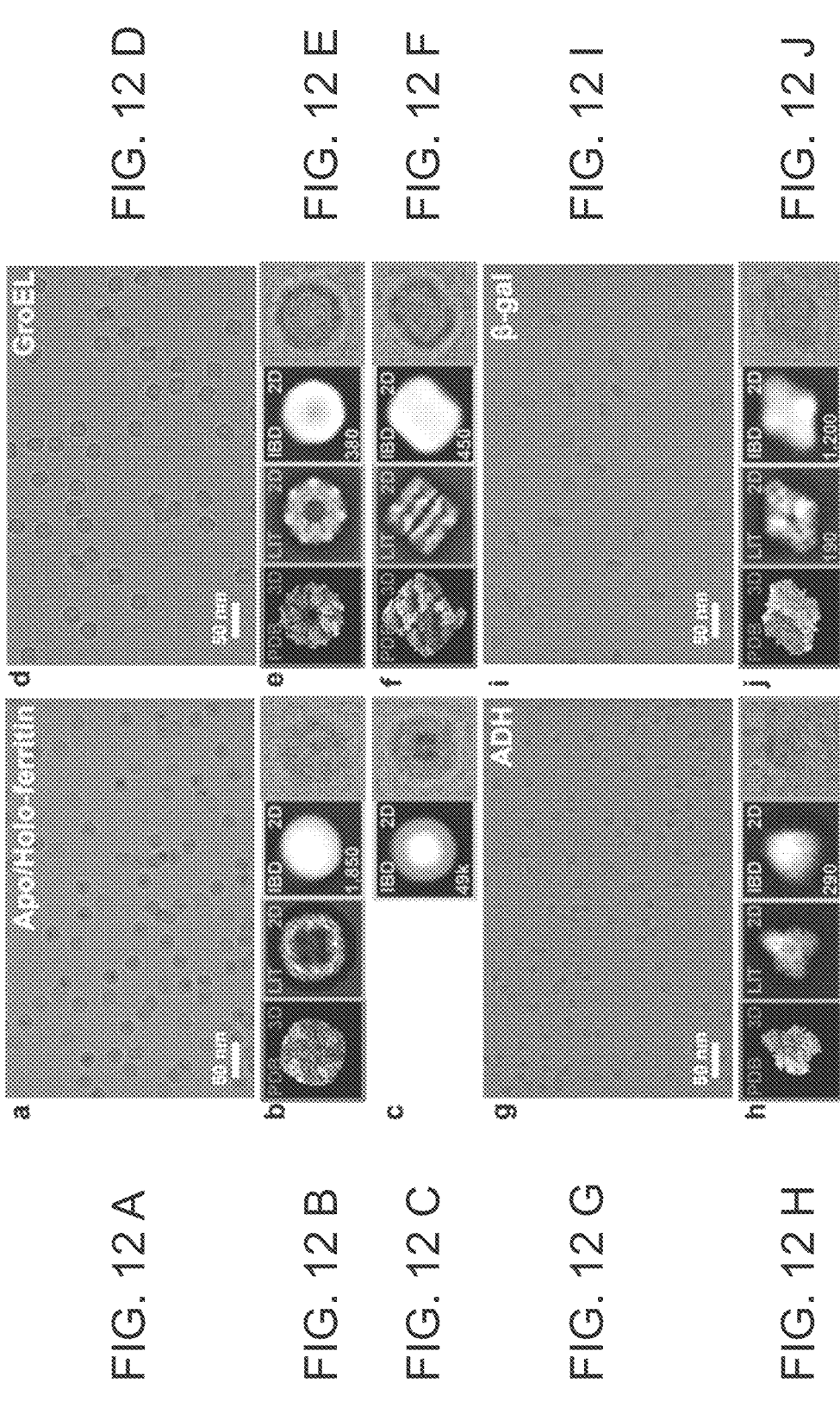

A manual freezing step was then added directly after deposition and transfer under ambient conditions. Cryogenic temperatures were then maintained throughout the transfer to the microscope and imaging. This workflow was applied to prepare and image native ES-IBD samples for a range of protein assemblies including apo/holo-ferritin (24-mer), alcohol dehydrogenase (ADH, tetramer), β-galactosidase (β-gal, tetramer), and GroEL (tetradecamer). These molecules cover a mass range from 147 kDa (ADH) to 803 kDa (GroEL), have characteristic shapes, and corresponding high resolution cryo-EM density maps are available in the PDB. For each sample, 50 micrographs were collected, resulting in up to 3,000 single particles. 2D classification using RELION 3.1 was performed. The resulting micrographs are shown in FIG. 12, along with 2D classes and representative single particles as well as corresponding 3D models from the PDB and published 2D classes obtained from traditional plunge-frozen cryo-EM samples of proteins in vitrified ice from grids with holey carbon films. 3D PDB models were rendered with ChimeraX using PDB entries 7A6A (apoferritin), 5W0S (GroEL), 7KCQ (ADH), and 6CVM (β-gal). 2D classes from literature were taken from Yip, K. M.; Fischer, N.; Paknia, E.; Chari, A.; Stark, H. Atomic-Resolution Protein Structure Determination by Cryo-EM. Nature 2020, 587, 157-161 (apoferritin), Rohou, A.; Grigorieff, N. CTFFIND4: Fast and Accurate Defocus Estimation from Electron Micrographs. Journal of Structural Biology 2015, 192, 216-221 (GroEL), Guntupalli, S. R.; Li, Z.; Chang, L.; Plapp, B. V.; Subramanian, R. Cryo-Electron Microscopy Structures of Yeast Alcohol Dehydrogenase. Biochemistry 2021, 60, 663-677 (ADH), and the RELION 3.0 tutorial data set (β-gal). The number of particles in the 2D classes is given where available.

FIG. 12(*a*) shows a sample prepared by depositing an apo-/holo-ferritin mixture. In contrast to the room temperature micrographs, now the ferritin protein shells are clearly visible around the iron cores when imaging samples at cryogenic temperatures after deposition. Apoferritin, barely visible when imaging at room temperature, can be clearly identified as well. The single apoferritin particle in FIG. 12(*b*) appears circular, but the corresponding 2D class has a slightly oval shape, suggesting a deformation of the protein shell during the workflow. For holoferritin, FIG. 12(*c*), the single particle shell is round on the outside and rectangular on the inside, closely resembling the PDB structure shown for apoferritin. This is confirmed in the 2D class but further analysis is inhibited as the classification algorithm is confounded by the high-contrast iron core. The preprint notes that interestingly, there are no indications of a localized deformation of the protein shell as for apoferritin and that this result is consistent with previous IMS data, suggesting a gas-phase collapse of the apoferritin cavity and stabilization of holoferritin by the iron core.

FIG. 12(*d*) shows a micrograph of a GroEL sample. A very high contrast is observed due to the high mass of 803 kDa and absence of ice. Top and side views can be identified unambiguously. The 2D classes of top and side views clearly show features of the characteristic barrel shape that are already apparent in the single particle images, including the central cavity, a heptameric symmetry in the top view, and the notch between the two heptamer rings in the side view. Further substructure, as present in the literature 2D classes, is not visible.

A micrograph of a sample of ADH, the lowest mass protein in this study at 147 kDa, is shown in FIG. 12(g). It demonstrates the remarkable contrast of ice-free samples, even for small proteins. Individual particles show characteristic triangular shapes which becomes much clearer in the 2D class shown in 12(h). However, due to a lack of homogeneous internal structure in the single-particle images, specific orientations could not be assigned unambiguously.

Finally, FIG. 12(i) shows a micrograph of a sample of β-gal, which is commonly used as a standard in cryo-EM due to its relatively high mass (466 kDa), high stability, and characteristic shape. In contrast to apo-/holo-ferritin and GroEL, β-gal has no iron core or cavity. Again, individual particles and their orientations can be identified unambiguously from the unfiltered micrograph. The most prominent diamond shaped 2D class and a corresponding single particle are shown in FIG. 12(j).

The preprint describes that generally, there is no evidence for unfolding into extended polypeptide chains or fragmentation into subunits. The significantly improved contrast and well-defined shape in the 2D classes of the ice free samples indicate consistency of low-resolution structural features among particles and preservation of quaternary structure. Particle dimensions in 2D classes indicate no lateral deviation from literature values. However, there is a consistent lack of defined internal structure compared to the 2D classes from conventionally prepared samples with vitreous ice.

Figure 13:
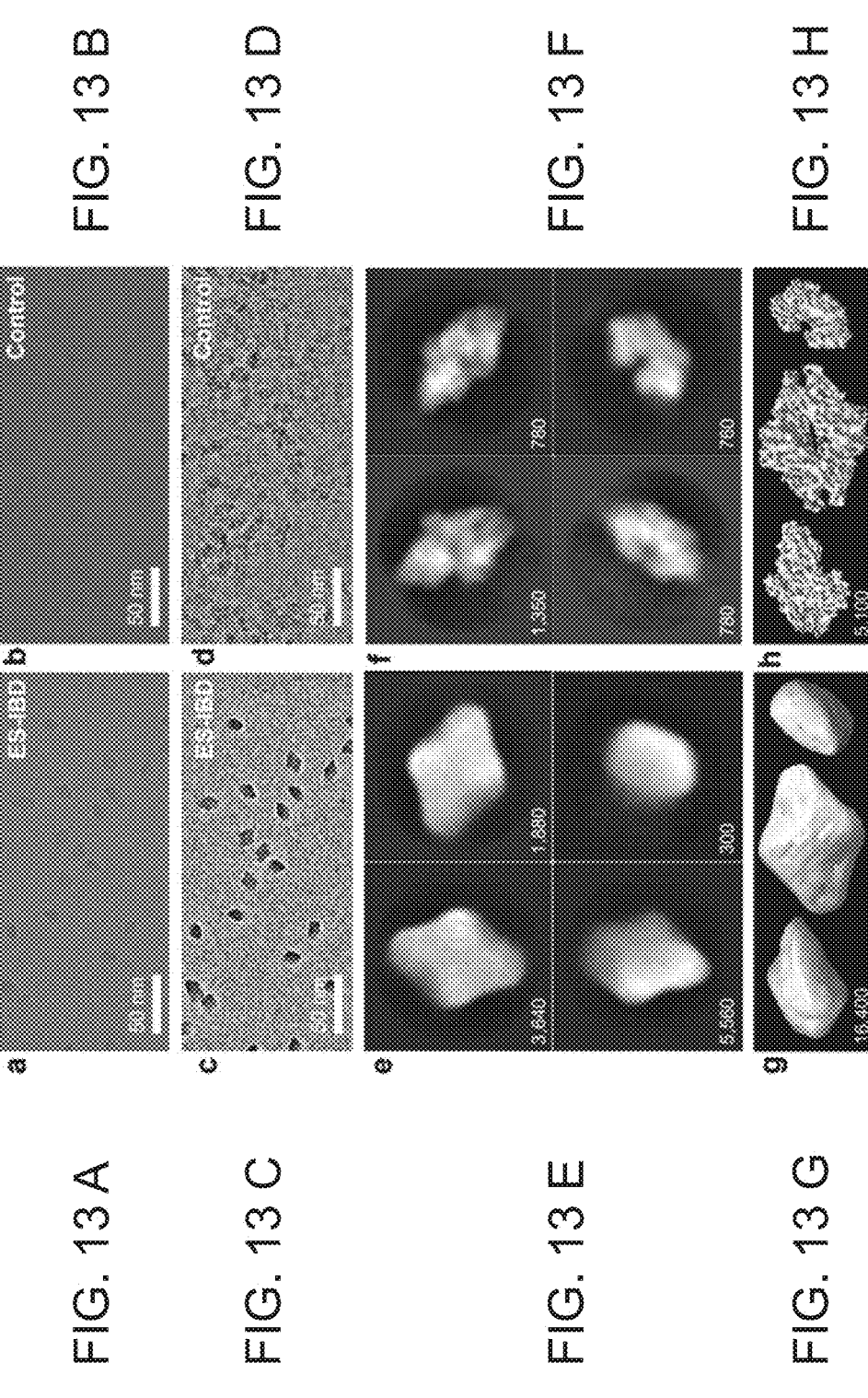

FIG. 13 shows unfiltered EM micrographs, band-pass filtered EM micrographs, 2D classes, and 3D EM density maps of both samples. The preprint describes that the particle contrast for the native ES-IBD sample is very high, the particle density is very homogeneous, and individual particles are well separated from each other. In contrast, the unfiltered micrograph of the vitrified control sample shows agglomerated particles. Individual particles and orientations are hard to identify by eye and only become visible after band-pass filtering. After 2D classification, randomly distributed particle orientations, as shown in FIG. 13(f), are obtained for the control sample, whereas strong preferred orientation is observed for the native ES-IBD sample. The latter exclusively shows three orientations, shown in FIG. 13(e), with a particle percentage of 56% (diamond shaped), 43% (tilted), and <1% (top).

Figure 14:
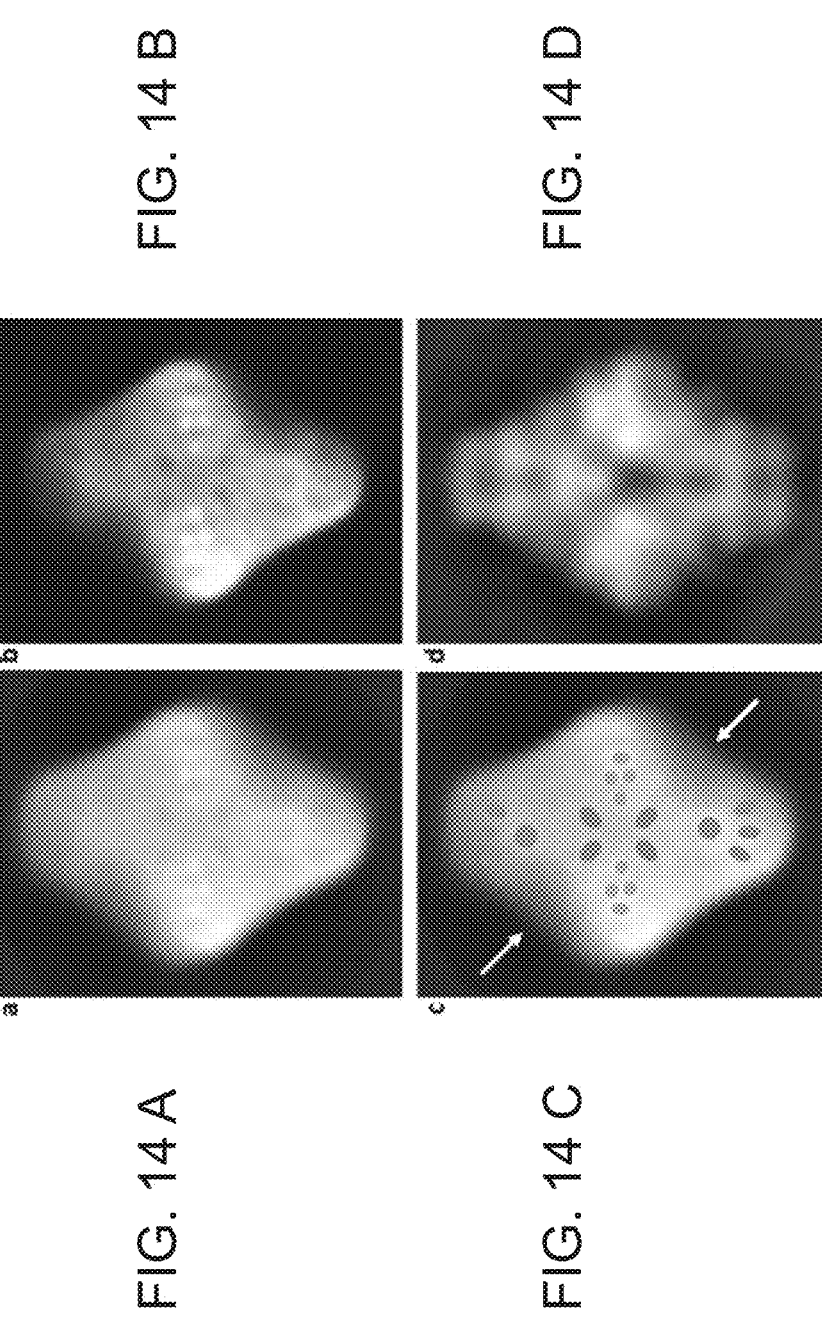

2D classes of the control sample show features of strong internal contrast, corresponding to secondary structure. These features are missing in the native ES-IBD sample, despite a much better contrast relative to the background. However, a characteristic symmetric pattern can be observed in the diamond-shaped 2D classes. It consists of clusters of 4 high-density spots, four low density spots around the center as well as at both tips. The smallest distance between the high-density spots is 8° A. In addition, two of the opposing diamond edges have lower contrast than the other two (see FIG. 14 for marked features). FIG. 14(a) is a detailed view of the diamond shaped class from the ice-free ES-IBD β-gal sample. FIG. 14(b) is the same view with increased contrast and reduced brightness to highlights characteristic internal features. FIG. 14(c) is the same view with marked features, including eight characteristic density maxima ((labelled with numeral (i)), four minima around the center ((labelled with numeral (iii)), and eight minima at the tips ((labelled with numeral (ii)). Arrows indicate edges with lower contrast, which possibly due to direct interaction of the two corresponding subunits with the substrate. All features agree qualitatively with the reference class FIG. 15(d), obtained from the RELION 3.0 tutorial data set. However, the features in the class from the ES-IBD sample appear smaller and more diffuse indicating a finite degree of structural heterogeneity.

Referring to the 3D EM density maps of the ES-IBD and control sample in FIGS. 14(g) and (h), respectively, the preprint notes that the level of information is consistent with that in the 2D classes. For the control sample, a 9° A (0.143 Gold-standard FSC) 3D EM density map was obtained and shows very good agreement with the secondary structure from the PDB (see FIG. 15). The corresponding 3D map from the native ES-IBD sample reliably reproduces the external features but lacks internal detail (see FIG. 15). To validate the results from SPA, electron chromatography (Cryo-ET) on a separate native ES-IBD sample to which gold fiducials were added before deposition was performed. The resulting tomogram was in good agreement with the 3D classes.

Figure 15:
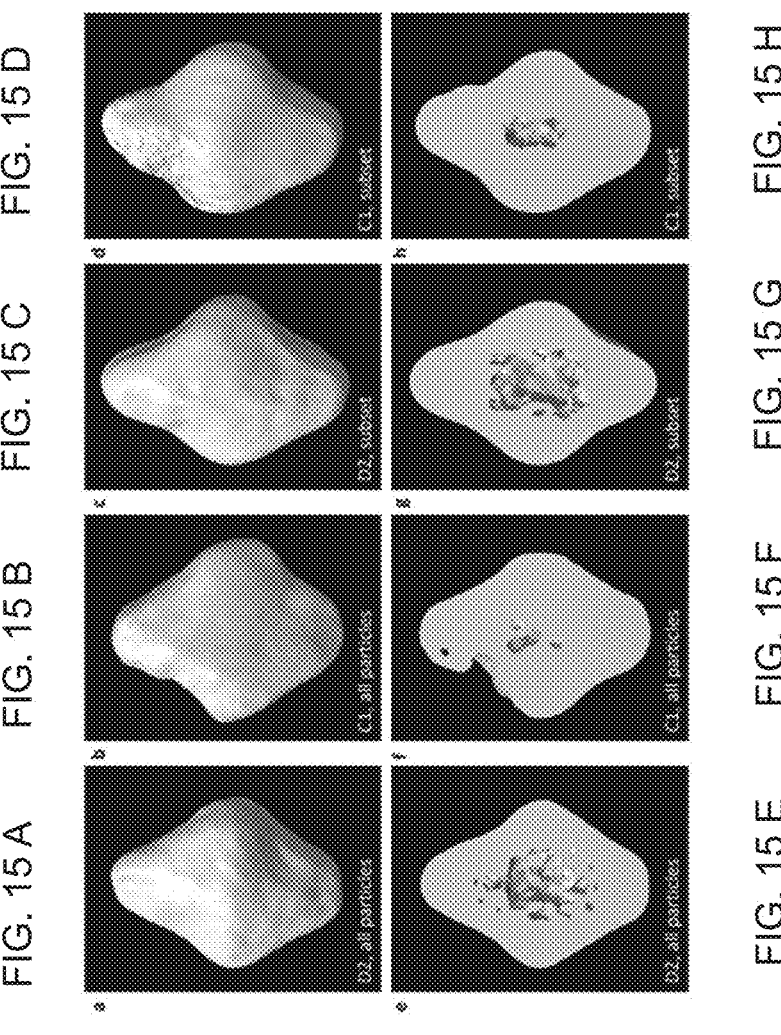

FIG. 15 shows 3D EM density maps of the native ES-IBD sample of β-gal. The panels indicate if no symmetry (C1) or dihedral symmetry (D2) was applied during the 3D auto-refine step in RELION. FIGS. 15(a) and (b) show structures that were obtained using all 50,000 particles while FIGS. 15(c) and (d) were generated using a subset of 16,400 particles. The images in the second row of FIG. 15 show cross-sections of the structures above.

Figure 16:
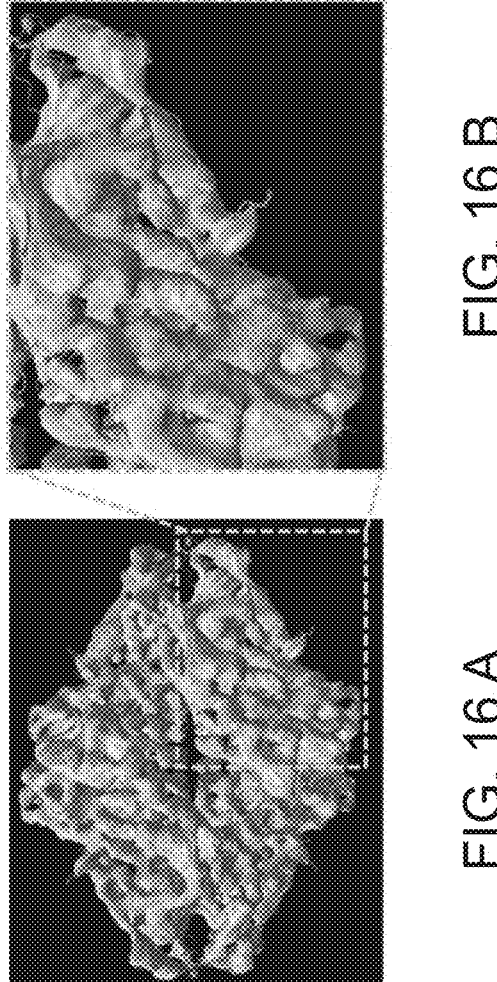

FIG. 16 is a 3D structure from β-gal control sample in ice, obtained using the same solution as for the native ES-IBD samples (200 mM ammonium acetate pH 6.9). The structure converged at a Gold-standard resolution (0.143 FSC) of 9° A. The preprint notes that the superimposed PDB model indicates very good agreement of secondary structure, allowing exclusion of protein preparation for mass spectrometry as a major bottleneck of the native ES-IBD workflow.

The preprint notes that the results therein shown that proteins remain folded and subunits in protein complexes remain attached to each other in their native orientation during sample preparation using native ES-IBD, despite dehydration, collision with the substrate, and prolonged exposure to the substrate-vacuum interface at room temperature. However, the resulting sample heterogeneity is currently limiting access to secondary structure. For β-gal, sub-nanometer resolution is routinely achieved using conventional vitrified samples, but this is not currently attained with native ES-IBD samples produced according to the method of these experiments. The preprint then discusses the main differences between the two sample preparation methods described therein that can explain this discrepancy.

The preprint notes that first, the successful generation of the 3D reference map shows that neither the preparation of the solution for mass spectrometry, the microscope performance and used settings, nor the number of collected single particle images is limiting access to secondary structure.

Second, the mass spectrum indicates that less than 100 water molecules remained attached to the gas-phase protein ion (based on spectral deconvolution and mass measurement), i.e., only a small fraction of the 4,194 structural water molecules in the PDB model. MD simulations and gas-phase experiments indicate that dehydration can lead to a range of kinetically trapped gas phase structures, however, the native secondary structure is typically largely preserved and gas-phase proteins are able to refold at least partially upon rehydration. The preprint notes that, in particular, it has been shown that enzymes can retain their activity after deposition onto liquid surfaces.

Figure 18:
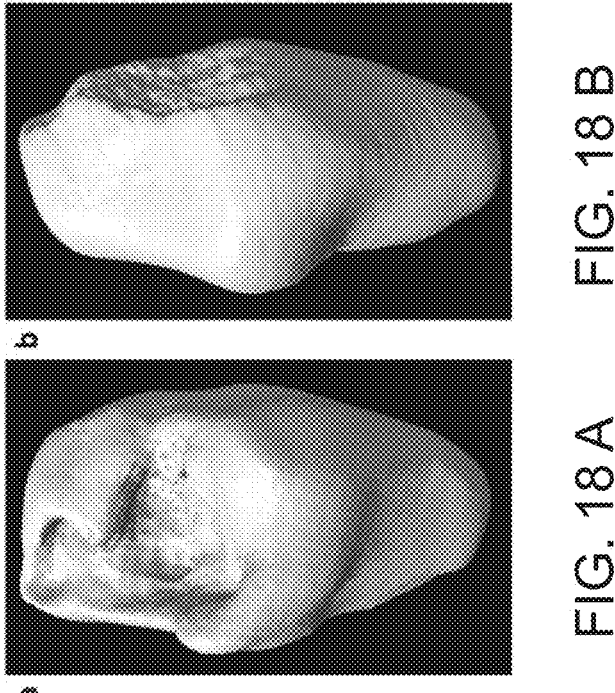

Third, particles may be damaged by the collision with the carbon film. The preprint notes that in the present case, β-gal molecules land with a kinetic energy of 2 eV per charge, corresponding to a velocity of about 200 m/s. The preprint notes that the nature and severity of damage caused by this type of collision are currently poorly characterized. Previous studies show that covalent bonds are unlikely to be affected or broken, but conformation can change. Localized damage of the protein surface and random orientations on impact could introduce sample heterogeneity that leads to loss of information during averaging. The preprint notes that it is intuitive to expect a larger deformation when a protein lands on a sharp edge rather than a flat plane. Indeed, when allowing for asymmetry in the 3D reconstruction for the ice-free native ES-IBD sample, classes that show a localized indentation close to one of the narrow tips of β-gal were obtained (see FIG. 18). FIGS. 18A and 18B show 3D EM density maps for ice-free ES-IBD β-gal sample obtained using C1 symmetry in RELION's automated refinement. FIG. 18(a) is a map obtained using a subset of 50,000 particles showing localized deformation, possibly due to orientation dependent deformation on landing. FIG. 18(b) is a map obtained from a subset of 16,400 particles, after multiple 2D and 3D classification steps, showing significantly less deformation.

Fourth, the protein samples spend up to 30 minutes at the substrate-vacuum interface at room-temperature before being frozen. This highly asymmetric environment can cause additional, thermally mediated deformation. E.g., the low contrast edges in the diamond shaped class of β-gal (see FIG. 54c) possibly indicates a stronger deformation of the two subunits that are in direct contact with the substrate. The preprint notes that the effect of the substrate-vacuum interface on particle orientations and structural integrity has been characterized for a broad range of materials. Its effect on proteins however, is still poorly understood and challenging to control. The preprint notes that further work is required to characterize the effects of various substrates and surface modifications on thermal motion, sample stability, and preferred orientation.

Fifth, particles can rehydrate during the brief transfer at ambient conditions in the workflow of these experiments. The preprint notes that limited control of the degree of rehydration in this step is a major limitation that needs to be addressed in the future.

Sixth, while the dependence of radiation damage on temperature has been investigated thoroughly, there is little research on the role of the ice layer, as direct comparison with ice-free samples was previously not possible. Likewise, the degree of damage due to dehydration has not been investigated systematically. The preprint notes that their workflow allow to address these effects directly, to gain a better understanding of the role that molecular waters play in these processes.

The preprint notes that finally, it is worth considering that data processing the SPA workflow is highly optimized for vitrified samples and may require adjustment to obtain more information from ice-free native ES-IBD samples.

The preprint concludes that in their workflow, the overall shape of protein assemblies and with it the secondary structure is largely preserved, but heterogeneity is introduced into the secondary and tertiary structure, by dehydration, landing, and surface interactions which limits the amount of information that can be obtained by averaging techniques. The preprint describes that a thorough characterization of the individual aspects discussed above is needed to improve sample quality and thus ultimately achievable experimental resolution.

The preprint describes that these experiments therefore implement native electrospray ion-beam deposition (native ES-IBD) as a novel approach for reproducible preparation of ice-free, homogeneously covered, and high-density cryo-EM samples. The experiments provide sample purity by mass-selecting a native protein ion-beam in a mass spectrometer. Protein conformation is largely preserved during transfer onto a TEM grid by carefully controlled native MS and soft landing. The fabrication of cryo-EM samples for a diverse selection of protein assemblies (apo/holo-ferritin, GroEL, ADH, and β-gal) was demonstrated. Particles stood out clearly against the background, even for proteins with a molecular weight around 150 kDa, and different orientations could typically be distinguished by eye in unfiltered micrographs. Further, that the experiments showed that 3D reconstruction from ice-free samples was possible using SPA (single-particle analysis).

The preprint describes that extensive optimization of the solution-based purification and vitrification was replaced by optimization of native MS conditions, which typically requires less expensive instrumentation, provides faster feedback, and offers orders of magnitude higher selectivity. Due to the modular design of their deposition stage, it was possible to modify the workflow to allow preparation of conformation-selective samples using IMS. Significant improvements in ion transmission were possible and promise fast preparation of ultra-pure samples of individual complexes, charge states, and even ligand bound states. Collection of sufficient particles for image reconstruction on a chromatographic timescale also appears possible. As these experiments were based on a commercial instrument, all these abilities can be transferred to other labs with reasonable effort.

The preprint describes that even with the limited resolution of these experiments, the mass-spectrometric information, selectivity, and strong contrast even in the unfiltered micrographs could be useful for screening and interpretation of higher resolution structures obtained using conventional cryo-EM. Further, native ES-IBD could provide complementary information to help address the challenges of the plunge freezing workflow discussed in the introduction. There may be great potential in eliminating solvent and ice-related issues, including denaturation at the air-solvent interface, strong and inhomogeneous background signal, unintentional devitrification, beam-induced motion of the ice, and inhomogeneous particle distribution.

The preprint describes that imaging proteins after controlled gas-phase exposure allows to address fundamental questions on the nature of the native-like gas-phase state, widely debated in native MS and IMS. The interaction of a protein with different solid surfaces in a hyperthermal collision is of great interest, as it provides a direct means to probe mechanical properties of the protein. While we typically perform experiments in the soft-landing regime to maintain biochemically relevant stoichiometry and native conformation, activation can be readily achieved, either within the mass spectrometer or by reactive landing or surface induced dissociation, to image collision-energy specific states and fragments.

The preprint describes that after 40 years in which the underlying principles of cryo-EM specimen preparation remained essentially unchanged, native ES-IBD enables a variety of truly novel work-flows. Establishing cryo-EM with samples from mass-selected protein deposition provides a great variety of research opportunities for structural biology, because it directly relates chemical information to biological structure.

Details of the Experiments Performed

Protein Preparation: Soluble proteins, alcohol dehydrogenase (ADH, A7011-15KU), β-gal (β-gal, G3153-5MG), ferritin (F4503-25MG), and GroEL (chaperonin 60, C7688-1MG), were purchased from Sigma Aldrich and used without further purification unless otherwise specified. Ammonium acetate (7.5 M, A2706-100ML), MeOH (1060352500), Acetone (1000145000) and buffer components for the reconstitution of GroEL, Tris (93362-250G), KCl (P9541-500G), EDTA (DS-100G), MgCl2 (63068-250G), ATP (A6419-1G), were also purchased from Sigma Aldrich. All concentrations are calculated with respect to the most abundant oligomers. Lyophilized powders of alcohol dehydrogenase, β-gal, and were resuspended in 200 mM ammonium acetate (pH 6.9) to a final concentration of 50 μM. The saline ferritin stock solution had a concentration of 260 μM.

GroEL was reconstituted from lyophilized powder. To this end, the powder was dissolved in 100 uL MeOH and 400 uL buffer, containing 20 mM Tris, 50 mM KCl, 0.5 mM EDTA, 5 mM MgCl2, 0.5 mg/mL ATP, mixed for 2 hours at room temperature, precipitated by adding 500 uL cold Acetone and centrifuged to form a pellet. After disposing of the supernatant, the pellet was resuspended in 250 uL of the original buffer and gently mixed overnight. The final solution had a concentration of 5 μM and was aliquoted and stored at −80° C. until use.

All proteins were desalted by passing through two P6 buffer exchange columns (7326222, Biorad), equilibrated with 200 mM ammonium acetate (pH 6.9). If applicable, they were then diluted in 200 mM ammonium acetate (pH 6.9) to reach the concentration used for native MS: 5 μM (alcohol dehydrogenase), 10 μM (β-gal), 8 μM (ferritin) 5 μM (GroEL). Buffer exchange was always done on the day of deposition.

Native Mass Spectrometry: As discussed and shown in the supplementary information of the preprint, an adapted version of Thermo Fisher Scientific, Inc's QExactive® quadrupole-Orbitrap® mass spectrometer was used to perform the native mass spectrometry. The standard transfer capillary with an i.d. of 0.58 mm was exchanged for a custom capillary (based on 590129, CS Chromatographie) with an i.d. of 0.75 mm, which moderately increased transmission. The aperture of the S-exit lens was increased from 1.4 to 2.5 mm, increasing transmission up to tenfold. An additional pump (XDS35, Edwards) was installed as a dedicated backing pump for the source turbomolecular pump to account for the additional gas load. Ions are thermalized in the collision cell at a pressure of approx. $10^{-2}$ mbar. A beam collector (electrometer), downstream of the collision cell exit lens, was removed to allow for continuous transmission of the ion-beam into a landing stage at a pressure of approx. $10^{-5}$ mbar. The latter allows the beam to be focused and steered onto a sample holder using only DC ion-optics. A sample holder comprised a retarding-grid ion-current detector, which records the ion beam intensity, total beam energy, and beam energy distribution, as well as two sample positions with variable DC potential, which allows the landing energy to be controlled and to monitor the total charge deposited.

Figures 17A, 17B, 17C, 17D:
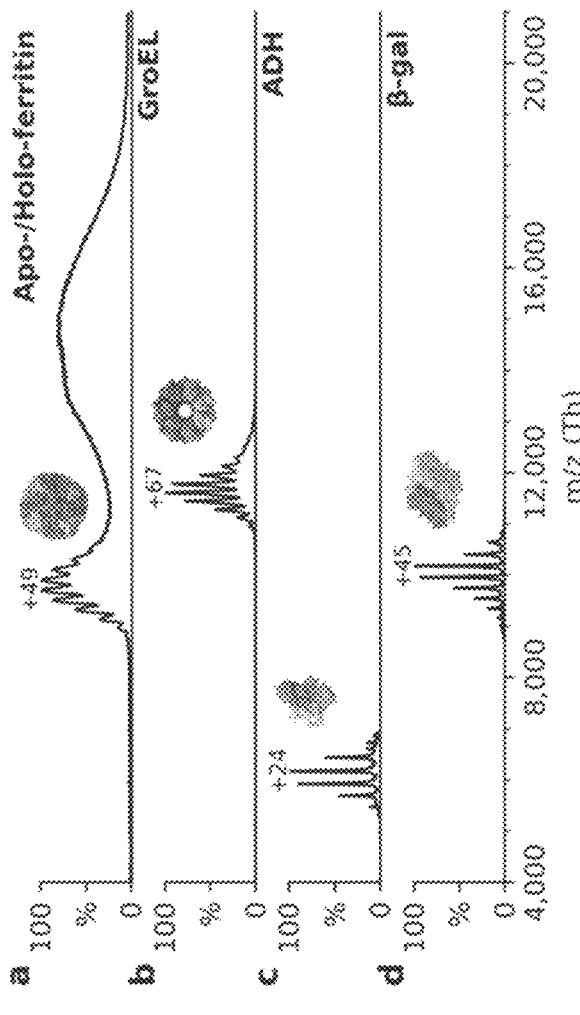

General instrument conditions were as follows: Source DC offset=21 V, S-lens Rf level=200 V, transfer capillary temperature=60° C., ion transmission settings set to "High m/z" (700 Vp−p for the injection flatapole, and 900 Vp−p, for the bent flatapole, transfer multipole, and collision cell), detector optimization "High m/z", injection flatapole=5 V, interflatapole lens=4 V, bent flatapole=2 V, transfer multipole=0 V, collision cell pressure setting 7 ($N_2$), collision cell multipole DC −5 V, collision cell exit lens −15 V. For collection of mass spectra the instrument was operated in standard mode, and for ion deposition, a modified scan matrix was used that allowed ions to pass through the C-trap and collision cell directly into the deposition stage, without trapping. Non-activating, native mass spectra of apo-/holo-ferritin, GroEL, ADH, and β-gal that were generated are shown in FIG. 17. For native ES-IBD experiments, native oligomers were mass selected, i.e., tetramer for ADH and β-gal and tetradecamer for GroEL. Both apo- and holo-ferritin were selected and deposited at the same time. The mass spectrum of holoferritin (right) shows no resolved charge states due to the continuous size distribution of iron cores in our sample. For all other proteins, the most abundant charge states are labelled. They are much lower than typical charge states from denatured samples indicating near-native gas-phase structures.

Borosilicate glass capillaries (30-0042, Harvard Bioscience) were pulled into nano electrospray ionization emitters, using a pipette puller (P-1000, Sutter Instrument), and gold coated using a sputter coater (108A/SE, Cressington). For native MS, up to 10 μL protein solutions were loaded into an emitter and the emitter tip was clipped to produce an opening of 0.1 to 10 μM. Electrospray ionization was initiated by applying a potential of 1.2 kV and a gentle nanoflow pressure (<200 mbar above atm).

TEM grids: Cu TEM grids with mesh size 400 were purchased from Agar Scientific, including 3 nm amorphous carbon on a lacey carbon film (AGS187-4) and holey carbon film (AGS174-3). A graphene oxide layer was added to the latter by plasma-cleaning for five minutes, drop casting of 3 μl graphene oxide suspension (763705-25ML, Sigma Aldrich), diluted in water to 0.2 mg/ml, blotting with filter paper (11547873, Fisherbrand) after one minute, followed by three washing and blotting steps with water. No further treatment was applied to grids before deposition.

Image Acquisition and processing: All micrographs were collected using microscopes at the COSMIC Cryo-EM facility at the Sir William Dunn School of Pathology, University of Oxford, UK. Room temperature screening was done on a Talos F200c (Thermo Fisher Scientific) cryo-TEM with Ceta detector. Micrographs of native ES-IBD samples of apo-/holo-ferritin as well as tomographic tilt series of β-gal were imaged on a Titan Krios 300 kV cryo-TEM (Thermo Fisher Scientific) with a BioQuantum energy filter and a K3 direct electron detector (both Gatan). All other data was acquired on a Talos Arctica 200 kV cryo-TEM with a Falcon 4 direct electron detector (both Thermo Fisher Scientific). Manual and automated data acquisition was controlled using EPU software (Thermo Fisher Scientific).

All Micrographs were recorded using a range of defocus settings between −1 and −3 μm. For the unfiltered micrographs shown in this work, the color range was adjusted to the data range, but no data was cut off and non-linear adjustments were applied. Typically, 50 micrographs were recorded per sample giving up to 3,000 particles and the magnification was 180E3 corresponding to a pixel size of 0.78° A.

For β-gal, two larger datasets of 3,000 and 900 EER movies were collected for the native ES-IBD and control sample, providing 50,000 and 90,000 particles, respectively. The magnification for this collection was 240E3 corresponding to a pixel size of 0.59° A and the total exposure was 40 e/° A2. For SPA, data was processed using RELION 3.1.75

Motion corrected MRC files were generated from EER files, using RELION's own implementation of MotionCor2 algorithm. Contrast Transfer Functions (CTFs) were estimated using CTFFIND 4.1 and used for CTF correction in the following steps. The high contrast obtained for native ES-IBD samples allowed for reliable automated particle picking based on a Laplacian-of-Gaussian (LoG) filter. Particles were extracted in 256×256 pixel boxes scaled down by a factor of 2. An initial 2D classification step was used to remove incorrectly picked particles and subsequent 2D classification produced the 2D classes shown.

A β-gal model from the PDB (6CVM), low-pass filtered to 60° A, was used as an initial model for 3D classification. 3D density maps were obtained from the native ES-IBD and control EER data set, using a subset of 16,400 and 5,100 particles, respectively, selected after multiple classifications. Particles were re-extracted in 560×560 pixel boxes and downscaled to 256×256 pixel boxes. The best-looking 3D class from the last classification was used as reference map, and scaled accordingly using the relion image handler program. The final structures were then produced using RELION's automated refinement. Videos of the resulting 3D EM density maps were generated using ChimeraX.

Plunge-freezing control sample: The control sample for β-gal were prepared using ammonium acetate solutions used for native ES-IBD and a Cu/Rh 200 mesh grid (Q2100CR2) from Quantifoil with 2 μm holes and 2 μm spacing between the holes. 3 μL of 5 μM solution was applied to the grid, followed by blotting and plunging into liquid ethane, using a Vitrobot (Thermo Fisher Scientific) at a relative humidity of 100% and a temperature of 10° C.

Tomography: A native ES-IBD sample of β-gal was prepared using the standard workflow, apart from adding gold fiducials (FG 10 nm, UMC Utrecht) before deposition. To this end 1 μg gold fiducials were dissolved in 20 μl of water and 2 μl were applied to a plasma cleaned grid which was then blotted after 30 seconds. Tilt series were acquired at a target defocus of 8 μm and with a pixel size of 3.47° A using the SerialEM software in low-dose mode, using a dose-symmetric tilt scheme. The K3 detector was operated in super-resolution counting mode using dose fractionation. The target tilt range was set to 130° (±65°), with increments of 1°, and a target total electron dose of 130 e/° A2 was used.

Cryo-ET data analysis was performed in IMOD using techniques described previously. Movies were aligned and dose-weighted using MotionCor2. Tilt series alignment was performed using gold fiducial tracking in IMOD. CTF was corrected using ctfphaseflip in IMOD. Tomographic reconstruction was carried out using the SIRT algorithm within Tomo3D and visualized using ImageJ.

The invention claimed is:

1. A method of preparing a sample of one or more molecules for imaging with a cryoelectron microscope, the method comprising:

providing a carrier substrate;

cryogenically cooling the carrier substrate to form a cryogenically-cooled carrier substrate;

generating gas phase ions of the one or more molecules by electrospray ionisation;

decelerating the gas phase ions; and receiving the gas phase ions on the cryogenically-cooled carrier substrate to form a sample for imaging with a cryo-electron microscope;

wherein the step of decelerating the ions reduces an energy of each of the ions to be less than 20 eV per charge when received at the cryogenically-cooled carrier substrate, wherein the step of generating gas phase ions comprises generating one or more charged gas-phase molecules, wherein, before the step of generating ions, the method comprises a step of receiving a solution comprising the one or more molecules dissolved in a solvent, wherein the step of generating gas phase ions comprises generating one or more charged gas-phase molecules comprising a solvation shell.

2. The method of claim 1, wherein the step of receiving the gas phase ions on the cryogenically-cooled carrier substrate is performed under vacuum and/or the step of decelerating the ions is performed under vacuum.

3. The method of claim 1, wherein the step of receiving the gas phase ions on the cryogenically-cooled carrier substrate is performed at a pressure of less than 10-3 mbar.

4. The method of claim 1, wherein the step of receiving the gas phase ions on the cryogenically-cooled carrier substrate is performed at a pressure of less than 10-4 mbar.

5. The method of claim 1, wherein the step of receiving the gas phase ions on the cryogenically-cooled carrier substrate is performed at a pressure equal to or less than a pressure of 10-5 mbar.

6. The method of claim 1, further comprising: controlling a temperature of an atmosphere in which the steps of decelerating the gas phase ions and receiving the gas phase ions on the cryogenically-cooled carrier substrate are performed and/or a partial pressure of solvent of the atmosphere in which the steps of decelerating the gas phase ions and receiving the gas phase ions on the cryogenically-cooled carrier substrate are performed such that the solvation shell of each charged gas-phase molecule is retained when each charged gas-phase molecule is received on the cryogenically-cooled carrier substrate.

7. The method of claim 1 further comprising: controlling a temperature of an atmosphere in which the steps of decelerating the gas phase ions and receiving the gas phase ions on the cryogenically-cooled carrier substrate are performed and/or a partial pressure of solvent of the atmosphere in which the steps of decelerating the gas phase ions and receiving the gas phase ions on the cryogenically-cooled carrier substrate are performed such that a rate of sublimation is less than a rate of condensation of the solvent.

8. The method of claim 1, wherein the step of receiving the gas phase ions of the one or more molecules on the cryogenically-cooled carrier substrate is performed under an atmosphere having a temperature of less than 250K.

9. The method of claim 1, where the solvent is water, wherein the steps of decelerating the gas phase ions and receiving the ions on the cryogenically-cooled carrier substrate is performed under an atmosphere having a partial pressure of water of greater than 1×10-10 mbar and a temperature of less than 130K.

10. The method of claim 1, where the solvent is water, wherein the steps of decelerating the gas phase ions and receiving the ions on the cryogenically-cooled carrier substrate is performed under an atmosphere having a partial pressure of water of greater than 1×10-10 mbar and a temperature of less than 100K.

11. The method of claim 1, wherein the steps of decelerating the gas phase ions and receiving the ions on the cryogenically-cooled carrier substrate is performed under an atmosphere having a partial pressure of water between 1×10-10 mbar and 1×10-7 mbar and a temperature of less than 100K.

12. A method of imaging a sample of one or more molecules, the method comprising:

the method of preparing a sample for a cryo-electron microscope of claim 1; and imaging the sample by cryo-electron microscopy.

13. The method of claim 12, wherein the method of preparing the sample is performed under vacuum;

the step of imaging the sample by cryo-electron microscopy is performed under vacuum in a cryo-electron microscope; and the method further comprises maintaining the vacuum and/or maintaining the carrier substrate to be cryogenically cooled between the step of preparing the sample and the step of imaging the sample.

14. The method of claim 12, further comprising controlling a temperature of an atmosphere in which the steps of decelerating the gas phase ions and receiving the gas phase ions on the cryogenically-cooled carrier substrate are performed and/or a partial pressure of solvent of the atmosphere in which the steps of decelerating the gas phase ions and receiving the gas phase ions on the cryogenically-cooled carrier substrate are performed such that the solvation shell of each charged gas-phase molecule is retained when each charged gas-phase molecule is received on the cryogenically-cooled carrier substrate; and wherein the method further comprises: retaining the solvation shell during the step of imaging the sample by cryo-electron microscopy.

15. An apparatus for preparing a sample of one or more molecules for a cryo-electron microscope, the apparatus comprising:

an electrospray ionisation source configured to generate one or more gas-phase molecules comprising a solvation shell from a solution comprising the one or more molecules dissolved in a solvent;

one or more ion optic devices configured to guide gas phase ions of the one or more molecules from the electrospray ionisation source towards a deposition chamber;

a voltage supply configured to apply a potential to a carrier substrate within the deposition chamber to receive the gas phase ions generated by the electrospray ionisation source;

a cryogenic cooling system configured to cryogenically cool a carrier substrate; and a controller configured to control the voltage supply to apply a potential to a cryogenically-cooled carrier substrate such that the gas phase ions generated by the electrospray ionisation source are decelerated to an energy of less than 20 eV per charge when received at a cryogenically-cooled carrier substrate.

16. The apparatus of claim 15, wherein the deposition chamber is under vacuum and/or wherein the one or more ion optic devices are arranged within a guiding chamber that is under vacuum.

17. The apparatus of claim 15, wherein the controller is further configured to: control a temperature of an atmosphere in which the gas phase ions are decelerated and received on the cryogenically-cooled carrier substrate and/or a partial pressure of solvent of the atmosphere in which the gas phase ions are decelerated and received on the cryogenically-cooled carrier substrate such that the solvation shell of each charged gas-phase molecule is retained when each charged gas-phase molecule is received on the cryogenically-cooled carrier substrate.

18. The apparatus of claim 15, wherein the controller is further configured to: control a temperature of an atmosphere in which the gas phase ions are decelerated and received on the cryogenically-cooled carrier substrate and/or a partial pressure of solvent of the atmosphere in which the gas phase ions are decelerated and received on the cryogenically-cooled carrier substrate such that a rate of sublimation is less than a rate of condensation of the solvent.

19. The apparatus of claim 15, wherein the controller is further configured to: control a temperature of an atmosphere in which the gas phase ions are decelerated and received on the cryogenically-cooled carrier substrate to be less than 250K.

20. The apparatus of claim 15, where the solvent is water, wherein the controller is further configured to: control a temperature of an atmosphere in which the gas phase ions are decelerated and received on the cryogenically-cooled carrier substrate to be less than 130K, preferably less than 100K and control a partial pressure of solvent of the atmosphere in which the gas phase ions are decelerated and received on the cryogenically-cooled carrier substrate to be greater than $1 \times 10\text{-}10$ mbar;

wherein the controller is further configured to: control the temperature of the atmosphere in which the gas phase ions are decelerated and received on the cryogenically-cooled carrier substrate to be less than 100K and control the partial pressure of solvent of the atmosphere in which the gas phase ions are decelerated and received on the cryogenically-cooled carrier substrate to be between $1 \times 10\text{-}10$ mbar and $1 \times 10\text{-}7$ mbar.

* * * * *